United States Patent
Peng et al.

(10) Patent No.: US 12,489,436 B2
(45) Date of Patent: Dec. 2, 2025

(54) DRIVE CIRCUIT AND DRIVE SYSTEM

(71) Applicant: HUAWEI TECHNOLOGIES CO., LTD., Guangdong (CN)

(72) Inventors: Xingqiang Peng, Dongguan (CN); Jingbo Xiao, Dongguan (CN); Liyuan Lu, Dongguan (CN); Shaoqing Dong, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 104 days.

(21) Appl. No.: 18/495,947

(22) Filed: Oct. 27, 2023

(65) Prior Publication Data
US 2024/0063782 A1 Feb. 22, 2024

Related U.S. Application Data

(63) Continuation of application No. PCT/CN2021/091725, filed on Apr. 30, 2021.

(51) Int. Cl.
*H03K 17/06* (2006.01)
*H03K 17/16* (2006.01)

(52) U.S. Cl.
CPC ......... *H03K 17/063* (2013.01); *H03K 17/165* (2013.01)

(58) Field of Classification Search
CPC ............... H03K 17/063; H03K 17/165; H03K 2217/0036; H03K 17/163
See application file for complete search history.

(56) References Cited

U.S. PATENT DOCUMENTS

| | | |
|---|---|---|
| 2004/0021498 A1 | 2/2004 | Scheikl |
| 2017/0155322 A1 | 6/2017 | Zhang et al. |
| 2017/0288653 A1* | 10/2017 | Yokoi ...................... H03K 5/08 |
| 2017/0288661 A1* | 10/2017 | Laschek-Enders ......................... H10D 84/811 |
| 2017/0373676 A1* | 12/2017 | Kaeriyama ........ H03K 17/0406 |
| 2018/0062633 A1* | 3/2018 | Nomura .................. H02M 1/08 |

FOREIGN PATENT DOCUMENTS

CN 111404529 A 7/2020

OTHER PUBLICATIONS

International Search Report and Written Opinion issued in PCT Application No. PCT/CN2021/091725 dated Jan. 26, 2022.
Extended European Search Report issued in EP Application No. 21938551.5 dated May 13, 2024.

\* cited by examiner

*Primary Examiner* — Metasebia T Retebo

(57) ABSTRACT

A drive circuit includes a first drive unit, a second drive unit, and a third drive unit. The first drive unit is configured to: when receiving a first control signal, output a first drive charging current to a gate end, so that a voltage at the gate end reaches a first threshold. The second drive unit is configured to output a second drive charging current to the gate end, so that the voltage at the gate end reaches a second threshold from the first threshold. The third drive unit is configured to: after the voltage at the gate end reaches the second threshold, output a third drive charging current to the gate end. The third drive charging current is greater than the first drive charging current and the second drive charging current. In this way, a turn-on loss may be reduced while meeting an electromagnetic interference requirement of the power device.

18 Claims, 16 Drawing Sheets

DRIVE CIRCUIT AND DRIVE SYSTEM

CROSS-REFERENCE TO RELATED APPLICATIONS

This is a continuation of International Application No. PCT/CN2021/091725, filed on Apr. 30, 2021, the disclosure of which is hereby incorporated by reference in its entirety.

TECHNICAL FIELD

The technology herein relates to the field of electronic technologies, and in particular, to a drive circuit and a drive system.

BACKGROUND

A switch mode power supply (SMPS), also referred to as a switched power supply or a switcher, is a type of electronic power supply and is a conversion apparatus that converts electrical power efficiently. The switch mode power supply switches between a full-on mode and a full-off mode through a power device, to convert a required voltage or current. In the switch mode power supply, turning on and off of the power device generates a voltage slope dv/dt or a current slope di/dt of a large signal, and electromagnetic interference (EMI) may be generated. This often affects normal operation of other nearby electronic devices. Therefore, it is necessary to adjust a turning on and off speed of the power device to reduce the EMI.

In the switch mode power supply, turning on and off of the power device is driven and controlled by a gate. Generally, a gate drive resistor is connected in series between a gate drive output end and a gate of the power device, and a turning on and off speed of the power device is adjusted by adjusting a value of the gate drive resistor.

However, this manner of adjusting gate drive resistance generates a large turn-on loss in a turn-on process of the power device.

SUMMARY

Embodiments of this specification provide a drive circuit and a drive system and relate to the field of electronic technologies. Drive units control drive charging currents segment by segment. In a turn-on process of a power device, when a voltage at a gate end does not reach a first threshold, a first drive unit outputs a first drive charging current; or when the voltage at the gate end reaches the first threshold, a second drive unit outputs a lower second drive charging current, to reduce EMI by reducing a turn-on speed of the power device; or when the voltage at the gate end reaches a second threshold, a third drive unit outputs a larger third drive charging current, to reduce a loss of the power device from being in Miller plateau to full turn-on of the power device. In addition, the drive circuit does not use a gate drive resistor, and may use a frame alone rather than a substrate for packaging. Therefore, packaging difficulty is simplified, and packaging costs are reduced.

Further, in a turn-off process of the power device, when the voltage at the gate end of the power device reaches the second threshold, the second drive unit outputs a lower second drive discharging current, to reduce a drive discharging current of the power device during the Miller plateau. This can reduce the EMI. When the voltage at the gate end reaches the first threshold, the third drive unit outputs a large third drive discharging current, to reduce oscillation of the power device after the Miller plateau, increase stability of the voltage at the gate end of the power device, and further improve safety of the power device.

According to a first aspect, an embodiment of this specification provides a drive circuit, where the drive circuit includes a first drive unit, a second drive unit, and a third drive unit. An output end of the first drive unit, an output end of the second drive unit, and an output end of the third drive unit are configured to connect to a gate end of a power device.

The first drive unit is configured to: when receiving a first control signal, output a first drive charging current to the gate end, so that a voltage at the gate end reaches a first threshold. The second drive unit is configured to output a second drive charging current to the gate end, so that the voltage at the gate end reaches a second threshold from the first threshold. The third drive unit is configured to: after the voltage at the gate end reaches the second threshold, output a third drive charging current to the gate end. The third drive charging current is greater than the first drive charging current and the second drive charging current. In this way, the second drive charging current is small, so that a turn-on speed of the power device may be reduced, and EMI may be further reduced. The third drive charging current is large, so that a turn-on loss may be reduced. In addition, the drive circuit may use a frame alone for packaging. This simplifies packaging difficulty and reduces packaging costs.

Optionally, a difference between the second threshold and a Miller plateau voltage of the power device is less than a first value.

Optionally, the second drive unit stops outputting the second drive charging current when the voltage at the gate end reaches the second threshold. Alternatively, the second drive unit continuously outputs the second drive charging current when the voltage at the gate end reaches the second threshold. In this way, turn-on time of the power device may be shortened, and a turn-on loss may be further reduced.

Optionally, the first drive unit is further configured to: when receiving a second control signal, output a first drive discharging current to the gate end, so that the voltage at the gate end reaches the second threshold. The second drive unit is further configured to output a second drive discharging current to the gate end, so that the voltage at the gate end reaches the first threshold from the second threshold. The third drive unit is further configured to: after the voltage at the gate end reaches the first threshold, output a third drive discharging current to the gate end. The third drive discharging current is greater than the first drive discharging current and the second drive discharging current. In this way, EMI of the power device may be reduced, oscillation generated when the power device is turned off may be reduced, stability of the voltage at the gate end of the power device may be improved, and safety of the power device may be improved.

Optionally, the second drive unit stops outputting the second drive discharging current when the voltage at the gate end reaches the first threshold. Alternatively, the second drive unit continuously outputs the second drive discharging current when the voltage at the gate end reaches the first threshold. Further, turn-off time of the power device is shortened, and safety of the power device is improved.

Optionally, the drive circuit further includes a feedback unit, an input end of the feedback unit is connected to the gate end, and an output of the feedback unit is configured to enable the first drive unit, the second drive unit, and the third drive unit.

The feedback unit is configured to: when the voltage at the gate end does not reach the first threshold, enable the first drive unit; or when the voltage at the gate end reaches the first threshold and does not reach the second threshold, enable the second drive unit, and disable the first drive unit; or when the voltage at the gate end reaches the second threshold, enable the third drive unit, and disable the second drive unit or continuously enable the second drive unit.

Alternatively, the feedback unit is configured to: when the voltage at the gate end does not reach the second threshold, enable the first drive unit; or when the voltage at the gate end reaches the second threshold and does not reach the first threshold, enable the second drive unit, and disable the first drive unit; or when the voltage at the gate end reaches the first threshold, enable the third drive unit, and disable the second drive unit or continuously enable the second drive unit.

In this way, the feedback unit may implement self-control of the drive circuit, and implement that the drive circuit automatically adjusts enabling and disabling of the drive unit based on the voltage at the gate end. Therefore, control accuracy of the drive circuit is improved.

Optionally, the feedback unit includes a first comparator, a second comparator, and a first decoder. A first input end of the first comparator is connected to the gate end, a second input end of the first comparator is connected to a first voltage, and an output end of the first comparator is connected to the first decoder, where a value of the first voltage is the first threshold. A first input end of the second comparator is connected to the gate end, a second input end of the second comparator is connected to a second voltage, and an output end of the second comparator is connected to the first decoder, where a value of the second voltage is the second threshold. A first output end of the first decoder is connected to an enabling end of the first drive unit, a second output end of the first decoder is connected to an enabling end of the second drive unit, and a third output end of the first decoder is connected to an enabling end of the third drive unit.

Optionally, a first delay unit is disposed between the second output end of the first decoder and the enabling end of the second drive unit, and/or a second delay unit is disposed between a third output end of the first decoder and the enabling end of the third drive unit. The first delay unit is configured to delay enabling of the second drive unit, and the second delay unit is configured to delay enabling of the third drive unit.

In this way, the delay unit may adjust a result output by the feedback unit, to avoid inaccuracy of the second threshold. Therefore, EMI and a switching loss are further reduced.

Optionally, the drive circuit further includes an adjustment signal generation unit, the adjustment signal generation unit is connected to the second drive unit, and the adjustment signal generation unit is configured to control the second drive unit to generate the second drive charging current or the second drive discharging current. The adjustment signal generation unit includes a reference current connector, a reference voltage connector, a resistor, a comparator array, and a second decoder. The reference current connector is connected to one end of the resistor and a reference current, the reference voltage connector is connected to the comparator array, the other end of the resistor is grounded, the one end of the resistor is further connected to an input end of the comparator array, an output end of the comparator array is connected to an input end of the second decoder, and an output end of the second decoder is connected to the second drive unit. The resistor is configured to generate a resistor voltage at the one end of the resistor based on the reference current. The comparator array is configured to generate a comparison signal based on a reference voltage and the resistor voltage. The second decoder is configured to control, based on the comparison signal, the second drive unit to output the second drive charging current or the second drive discharging current.

In this way, EMI requirements of power devices with different internal resistances may be met, so that the drive circuit is applicable to a plurality of cases, and applicability of the drive circuit is improved.

Optionally, the adjustment signal generation unit further includes a third decoder. The output end of the comparator array is further connected to an input end of the third decoder, and an output end of the third decoder is connected to the second delay unit. The third decoder is configured to control, based on the comparison signal, the second delay unit to delay enabling of the third drive unit.

In this way, it is convenient to adjust, based on an actual situation, time for outputting a driving current by the third drive unit, inaccuracy in actual production and use of the drive circuit is avoided, and practicability of the drive circuit is improved.

Optionally, the first drive unit includes a first charging current control module and a first discharging current control module. The first charging current control module is configured to control a value of the first drive charging current, and the first discharging current control module is configured to control a value of the first drive discharging current. The second drive unit includes a second charging current control module and a second discharging current control module, the second charging current control module is configured to control a value of the second drive charging current, and the second discharging current control module is configured to control a value of the second drive discharging current. The third drive unit includes a third charging current control module and a third discharging current control module, the third charging current control module is configured to control a value of the third drive charging current, and the third discharging current control module is configured to control a value of the third drive discharging current.

Optionally, the first charging current control module, the second charging current control module, and the third charging current control module all include a plurality of P-type transistors connected in parallel. The first discharging current control module, the second discharging current control module, and the third discharging current control module each include a plurality of N-type transistors connected in parallel.

Optionally, the first threshold is a threshold voltage of the power device, the first control signal is a rising edge or a falling edge of a pulse width modulation signal, and the second control signal is the falling edge or the rising edge of the pulse width modulation signal.

According to a second aspect, an embodiment of this specification provides a drive system, including a power device and the drive circuit according to any one of the first aspect, where the drive circuit is configured to drive the power device to turn on or turn off.

The drive system may be a drive system applied to various electrical and electronic devices, and the electrical and electronic devices may be a program-controlled switch, a communication device, an electronic detection device, a control device, and the like.

For beneficial effects of the drive system provided in the second aspect and the possible designs of the second aspect, refer to beneficial effects brought by the first aspect and the possible implementations of the first aspect. Details are not described herein again.

According to a third aspect, an embodiment of this specification provides a drive module, including the drive circuit according to any one of the first aspect, where the drive circuit is configured to drive a power device to turn on or off.

The drive module may be a module including the drive circuit, and may be a module further including a controller and/or the power device, and the like.

For beneficial effects of the drive module provided in the third aspect and the possible designs of the fourth aspect, refer to beneficial effects brought by the first aspect and the possible implementations of the first aspect. Details are not described herein again.

According to a fourth aspect, this specification provides an electronic device, including a power system, a power device, and the drive circuit according to any one of the first aspect, where the drive circuit is configured to drive the power device to turn on or turn off, and the power system is configured to supply electricity to the drive circuit.

The electronic device may be a switch mode power supply of various electrical and electronic devices, including but not limited to an adapter that supplies power to a terminal device, a server power supply, and the like. The terminal device may be a device such as a mobile phone or a tablet computer. The electrical and electronic devices may be a program-controlled switch, a communication device, an electronic detection device, a control device, and the like. Alternatively, the electronic device may be an electronic device including the drive module in the third aspect.

For beneficial effects of the electronic device provided in the fourth aspect and the possible designs of the fourth aspect, refer to beneficial effects brought by the first aspect and the possible implementations of the first aspect. Details are not described herein again.

DESCRIPTION OF EMBODIMENTS

To clearly describe the technical solutions in embodiments of this specification, words such as "first" and "second" are used in embodiments of this specification to distinguish between same items or similar items that have basically a same function or purpose. For example, a first drive unit and a second drive unit are merely used to distinguish between different drive units, and a sequence of the first drive unit and the second drive unit is not limited. A person skilled in the art may understand that the terms such as "first" and "second" do not limit a quantity or an execution sequence, and the terms such as "first" and "second" do not indicate a definite difference.

It should be noted that, in this specification, terms such as "an example" or "for example" are used to represent an example, an instance, or an illustration. Any embodiment or design scheme described as an "example" or "for example" in this specification should not be explained as being more preferred or having more advantages than another embodiment or design scheme. To be precise, the word such as "example" or "for example" is intended to present a related concept in a specific manner.

A drive circuit provided in embodiments of this specification may be applied to a switch mode power supply. The switch mode power supply may be a switch mode power supply of various electrical and electronic devices, and the electrical and electronic devices may be a program-controlled switch, a communication device, an electronic detection device, a control device, and the like. For example, the switch mode power supply may be used for an adapter of an electronic device, or may be used for a server power supply, or the like.

The gate drive circuit and the apparatus provided in embodiments of this specification may be used in a plurality of topologies of a switch mode power supply, for example, a single-ended gate drive system, an isolation gate drive system, and a half-bridge gate drive system. The following describes a plurality of topologies of the switch mode power supply.

Figure 1:
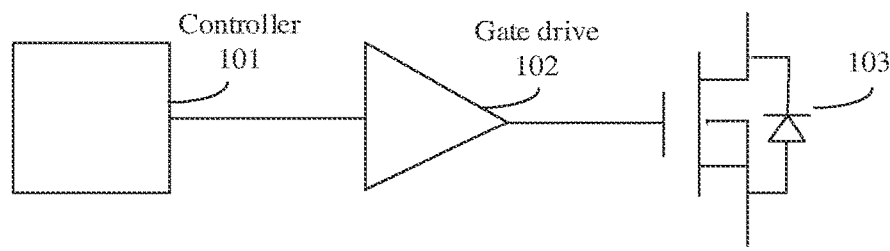
FIG. 1 is a schematic diagram of a single-ended gate drive system.

For example, FIG. 1 is a schematic diagram of a single-ended gate drive system. As shown in FIG. 1, the switch mode power supply includes a controller 101, a gate drive 102, and a power device 103.

The controller 101 is configured to generate a control signal, for example, a pulse width modulation (PWM) signal. The control signal may control the gate drive 102 to generate a drive charging current or a drive discharging current, to control turn-on and turn-off of the power device 103. For example, when a square wave displayed by the control signal is on a rising edge, the gate drive 102 generates a drive charging current, to charge the power device 103. When the square wave displayed by the control signal is on a falling edge, the gate drive 102 generates a drive discharging current to discharge the power device 103. The gate drive circuit provided in this embodiment of this specification may be used in the gate drive 102 in FIG. 1.

The power device 103 is configured to convert a voltage or a current required by a user end. The power device 103 controls, by turning on or turning off the power device 103, the voltage or the current required by the user end. The power device 103 may be a semiconductor device made of a first-generation semiconductor material such as silicon and germanium, or may be a semiconductor device made of a second-generation semiconductor material such as gallium arsenide and indium phosphide, or may be a semiconductor device made of a third-generation semiconductor material such as gallium nitride (GaN) and silicon carbide (SiC).

Figure 2:
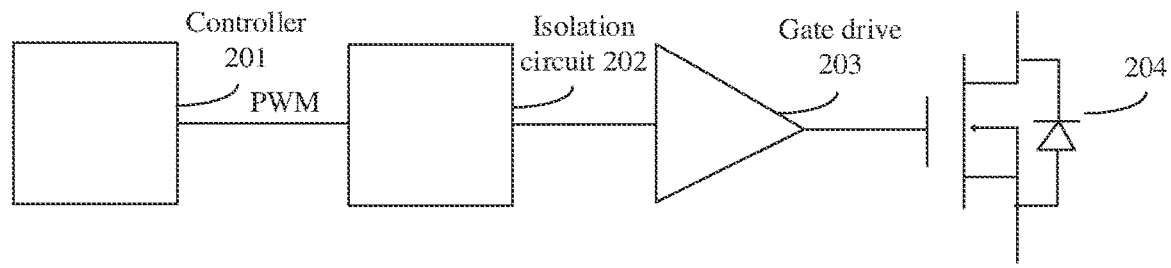
FIG. 2 is a schematic diagram of an isolation gate drive system.

For example, FIG. 2 is a schematic diagram of an isolation gate drive system. The isolation gate drive system includes a controller 201, an isolation circuit 202, a gate drive 203, and a power device 204. Compared with a single-ended gate drive system, the isolation circuit 202 is added to the isolation gate drive system. The isolation circuit 202 is used for electrical isolation to ensure physical security of the system. The isolation circuit 202 may cut off a ground loop to protect the system from transient high voltage impact. The gate drive circuit provided in this embodiment of this specification may be used in the gate drive 203 in FIG. 2.

Figure 3:
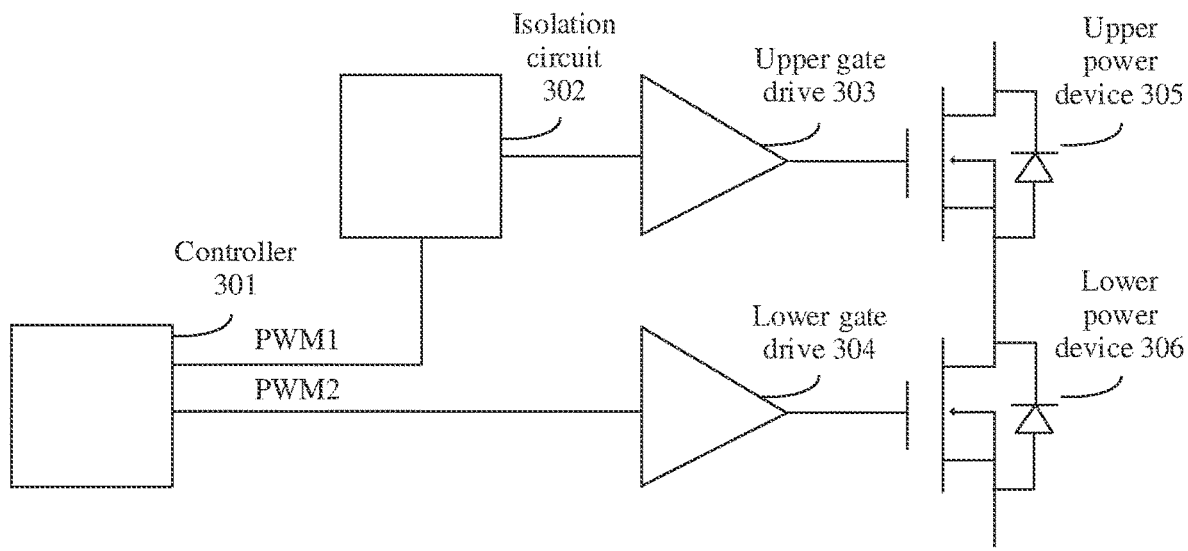
FIG. 3 is a schematic diagram of a half-bridge gate drive system.

For example, FIG. 3 is a schematic diagram of a half-bridge gate drive system. The half-bridge gate drive system includes a controller 301, an isolation circuit 302, an upper gate drive 303, a lower gate drive 304, an upper power device 305, and a lower power device 306. The upper gate drive 303 is configured to generate a drive charging current or a drive discharging current based on a PWM1 control signal generated by the controller, and control turn-on and turn-off of the upper power device 305. The lower gate drive 304 is configured to generate a drive charging current or a drive discharging current based on a PWM2 control signal generated by the controller, and control turn-on and turn-off of the lower power device 306. Both the PWM1 control signal and the PWM2 control signal may be PWM signals. The PWM1 control signal and the PWM2 control signal may be the same or different.

The upper power device 305 and the lower power device 306 are configured to convert a voltage or a current required by the user end. In the half-bridge gate drive system shown in FIG. 3, two power devices are connected, and a voltage or a current output by the power device may be automatically balanced, thereby enhancing stability of the system. The gate drive circuit provided in this embodiment of this specification may be used in the upper gate drive 303 and/or the lower gate drive 304 in FIG. 3.

Figure 4:
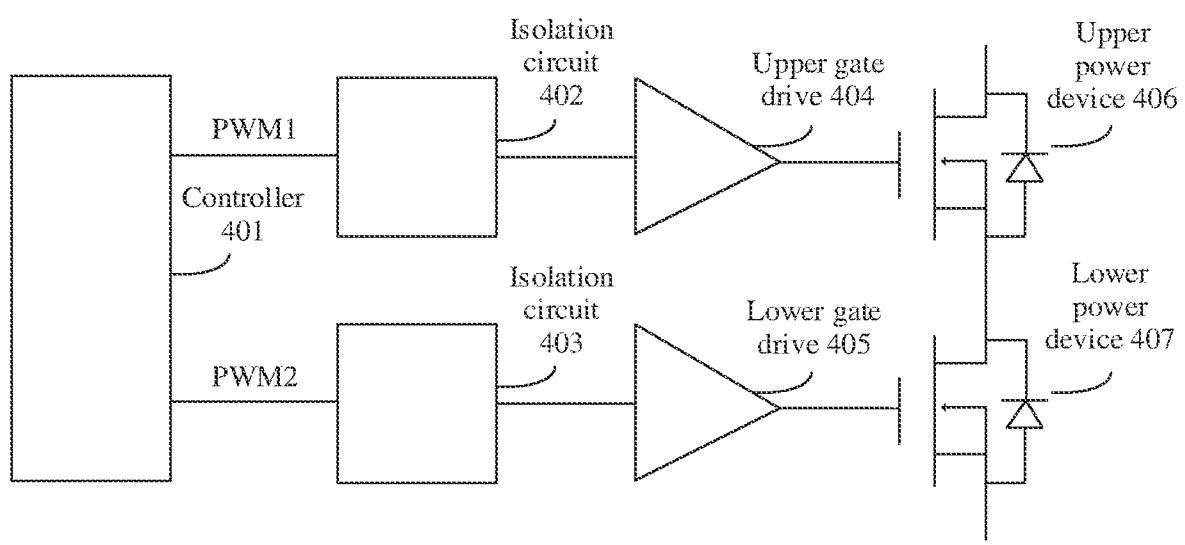
FIG. 4 is a schematic diagram of a half-bridge gate drive system.

For example, FIG. 4 is a schematic diagram of another half-bridge gate drive system. The half-bridge gate drive system includes a controller 401, an upper isolation circuit 402, a lower isolation circuit 403, an upper gate drive 404, a lower gate drive 405, an upper power device 406, and a lower power device 407. The upper isolation circuit 402 may cut off a ground loop, and protect the upper gate drive 404 and the upper power device 406 from transient high voltage impact. The lower isolation circuit 404 may cut off the ground loop, and protect the lower gate drive 405 and the lower power device 407 from transient high voltage impact.

The gate drive circuit provided in this embodiment of this specification may be used in the upper gate drive 404 and/or the lower gate drive 405 in FIG. 4.

It should be noted that a switch mode power supply is a high-frequency electric energy conversion apparatus. The switch mode power supply obtains a voltage or a current required by the user end through conversion by controlling a power device to switch between a full-on mode and a full-off mode.

In the switch mode power supply, turning on and off of the power device generates a voltage slope dv/dt or a current slope di/dt of a large signal. If voltage or current switching of the large signal is not processed, electromagnetic interference (EMI) may appear, affecting the normal operation of other electronic devices.

With a trend of operating switch mode power supplies at higher frequencies, a gallium nitride (GaN) power device with a smaller gate parasitic capacitance, a smaller on-resistance in a same area, and a faster switching speed gradually replaces a metal-oxide-semiconductor field-effect transistor (MOSFET) power device, and is used in a switch mode power supply with a high switching frequency. The GaN power device has high power density output and energy conversion efficiency, which can reduce the size and weight of the module, thereby reducing manufacturing and production costs of the module. The GaN power devices can be packaged together with a plurality of bare chips to replace a traditional separate device mode. The gate drive and the GaN power device are packaged together into a single device, to further reduce a module size and reduce production costs.

However, a fast switching speed and a high switching frequency of GaN power devices make the EMI problem more serious. Therefore, it is necessary to adjust a switching speed of the power device to reduce the EMI.

The following describes possible EMI reduction manners with reference to FIG. 5 to FIG. 9.

Figure 5:
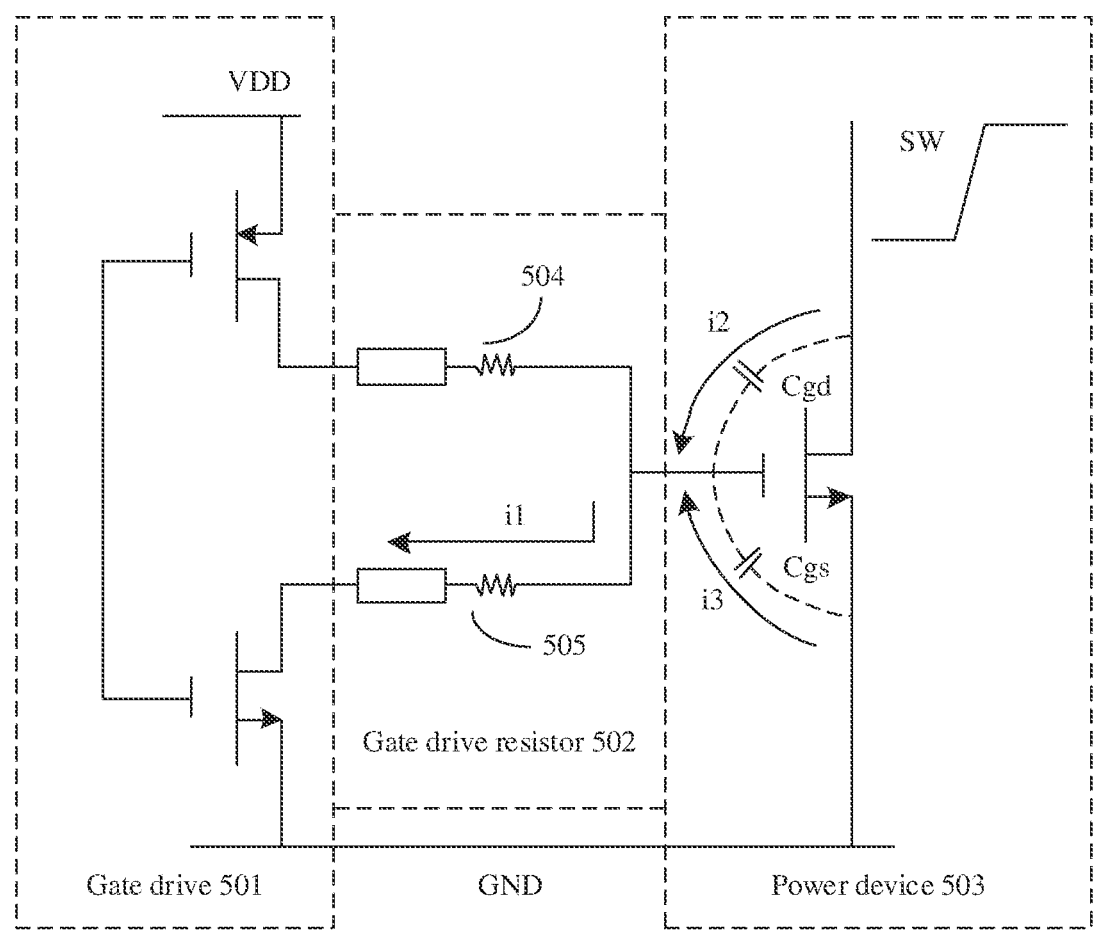
FIG. 5 is a schematic diagram of a circuit of a gate drive output end and a gate of a power device.

Manner 1: A gate drive resistor is added to a circuit. For example, FIG. 5 is a schematic diagram of a circuit of a gate drive output end and a gate of a power device. As shown in FIG. 5, the circuit includes a gate drive 501, a gate drive resistor 502, and a power device 503. The gate drive resistor 502 is connected in series between an output end of the gate drive 501 and a gate of the power device 503.

The gate drive resistor 502 includes a $R_{on}$ resistor 504 and a $R_{off}$ resistor 505. The $R_{on}$ resistor is connected in series in a charging loop of the power device. A resistance value of the $R_{on}$ resistor is negatively correlated with a drive charging current. A switch mode power supply may reduce the drive charging current by increasing the resistance value of the $R_{on}$ resistor, thereby reducing a turn-on speed of the power device and reducing EMI when the power device is turned on.

For example, when there is no $R_{on}$ resistor in the charging loop, an input voltage VDD charges the power device, and the drive charging current in the charging loop is large, resulting in large EMI. When there is the $R_{on}$ resistor in the charging loop, the VDD charges the power device through the $R_{on}$ resistor. Resistance in the charging loop increases, the drive charging current in the charging loop decreases, and the generated EMI decreases.

The $R_{off}$ resistor is connected in series in a discharging loop of the power device, and a resistance value of the $R_{off}$ resistor is negatively correlated with a drive discharging current. The switch mode power supply increases the resistance of the $R_{off}$ resistor to reduce the drive discharging current, reduce a turn-off speed of the power device, and reduce the EMI when the power device is turned off.

However, in a manner in which the gate drive resistor is used, a drive charging current of the power device after the Miller voltage plateau may be small, thereby causing a large switching loss. In addition, when the power device is turned off and the value of $R_{off}$ is excessively large, the power device may be turned on by mistake. For example, assume the power device is an N-channel metal-oxide semiconductor field-effect transistor (NMOSFET). When the NMOSFET is turned off, a drain voltage of the NMOSFET increases. As shown in FIG. 5, a current i2 generated by a parasitic capacitor Cgd in the NMOSFET charges the gate of the power device, and a gate voltage of the power device releases the gate voltage through a discharge path represented by i1. Because i2 also charges a Cgs, when the Cgs is discharged, i3 is generated, and i3 is also released through the discharge path represented by i1. When the value of $R_{off}$ is excessively large, the drive discharging current i1 is small. As a result, the gate voltage is not released in time, and the power device is turned on by mistake.

Figure 6:
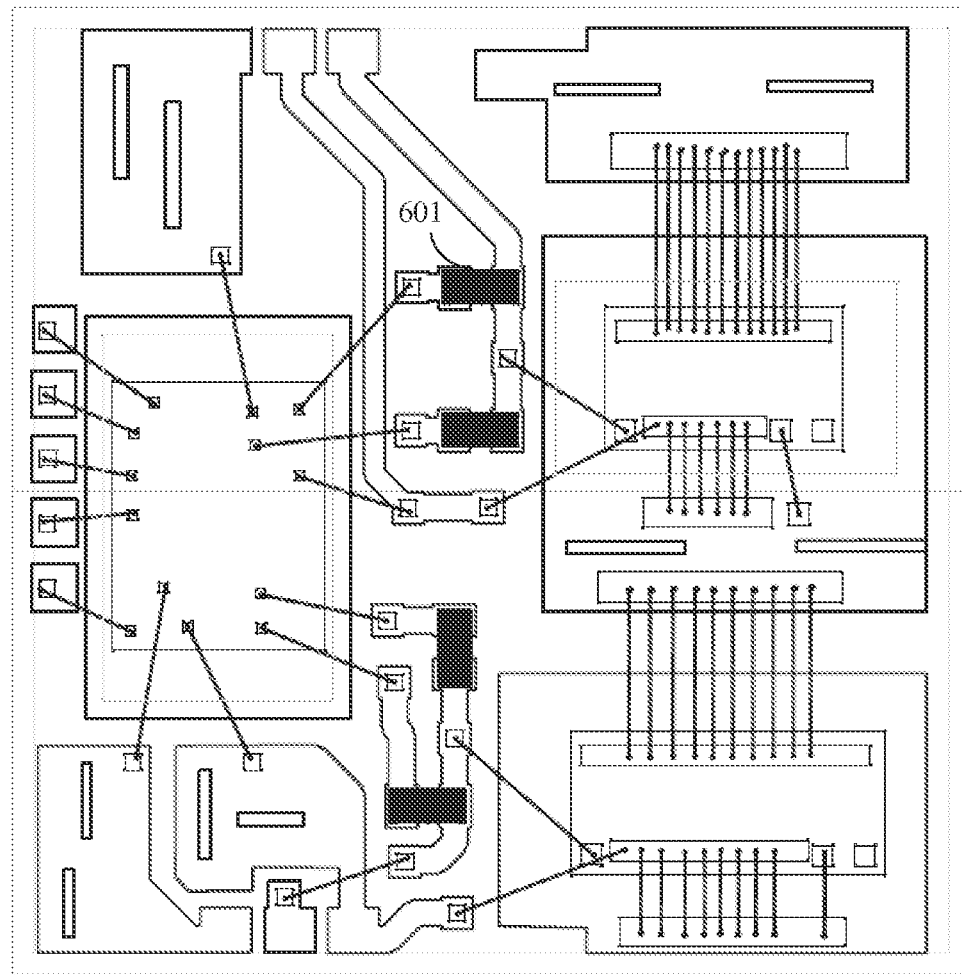
FIG. 6 is a schematic diagram of packaging of a gate drive, a gate resistor, and a power device according to an embodiment.

In addition, to reduce a circuit volume, when the gate drive, the gate drive resistor, and the power device are packaged together, the gate drive resistor needs to be packaged in a form of a substrate or in a form of a mixture of a substrate and a frame. Such packaging difficulty is high, and packaging costs are high. For example, FIG. 6 is a schematic diagram of a structure of packaging of a gate drive, a gate drive resistor, and a power device As shown in FIG. 6, a black box 601 is an independently packaged gate drive resistor, and the gate drive resistor is connected to the gate drive and the power device by using package interconnection. When packaging in this way, packaging difficulty is high, and packaging costs are high.

Figure 7:
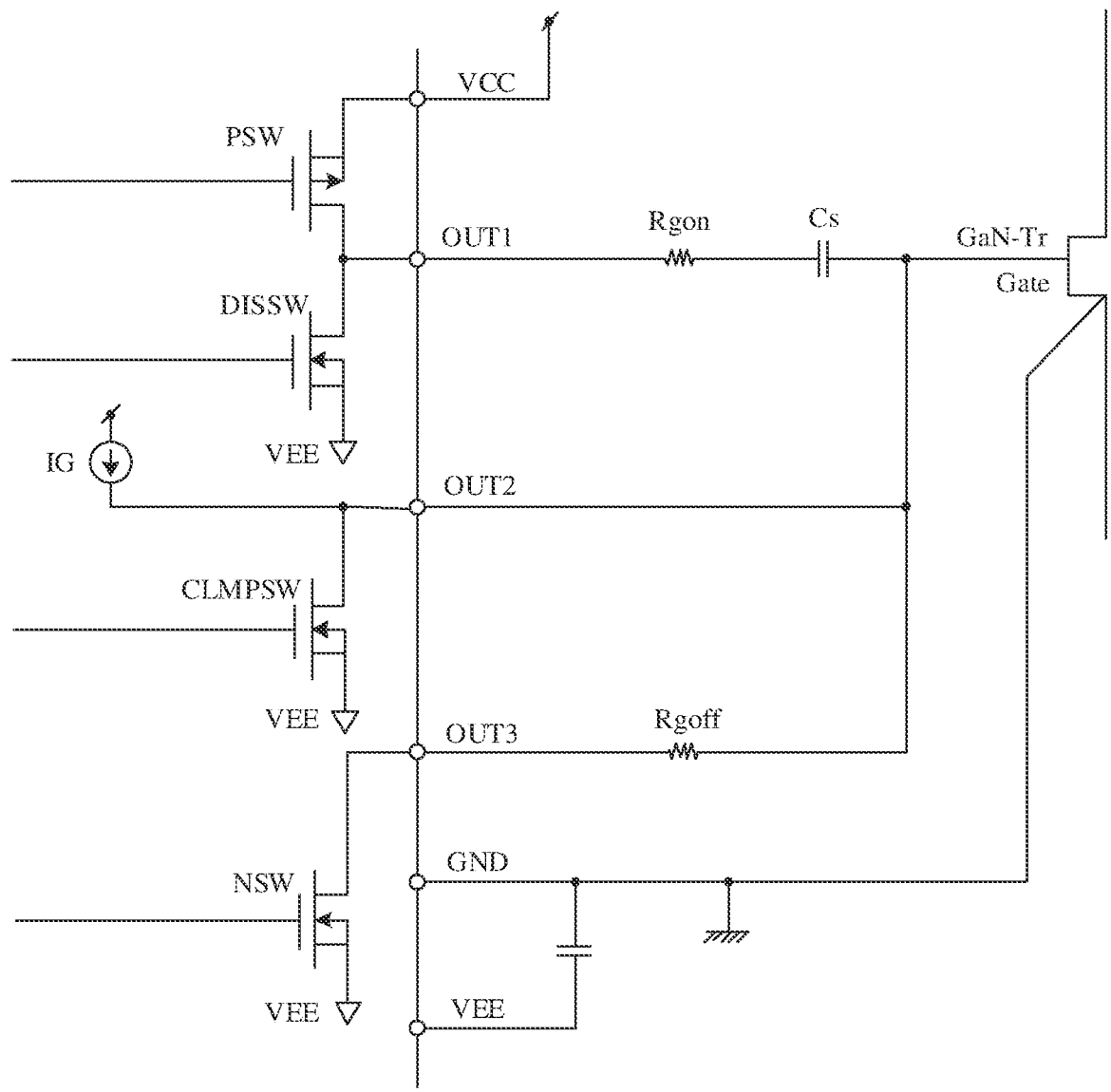
FIG. 7 is a schematic diagram of a circuit of a negative voltage turn-off circuit.

Manner 2: On the basis of increasing a gate resistor, a negative voltage turn-off circuit is added. As shown in FIG. 7, PSW in the figure indicates a charging transistor, and is used to generate a charging current. In FIG. 7, CLMPSW indicates a clamp transistor, and is used to turn off a GaN power device by using a negative voltage. In the preceding figure, NSW indicates the discharging transistor, and is used to generate discharging current. When the GaN power device is turned off, NSW generates the discharging current, and a gate voltage of the GaN power device decreases. When the GaN power device decreases to a voltage, CLMPSW is turned on, and the gate voltage of the GaN power device decreases to a VEE voltage. The GaN power device is turned off based on the VEE voltage. The VEE voltage is usually a negative voltage.

For example, when no negative voltage turn-off circuit is added to the drive circuit, the gate voltage ranges from 0 V to 6 V. After the negative voltage turn-off circuit is added, the gate voltage changes to −2 V to 6 V. The power device may keep being turned off in a negative voltage state. In this way, a case in which the power device is turned on by mistake due to an excessively large value of $R_{off}$ can be avoided.

Figure 8:
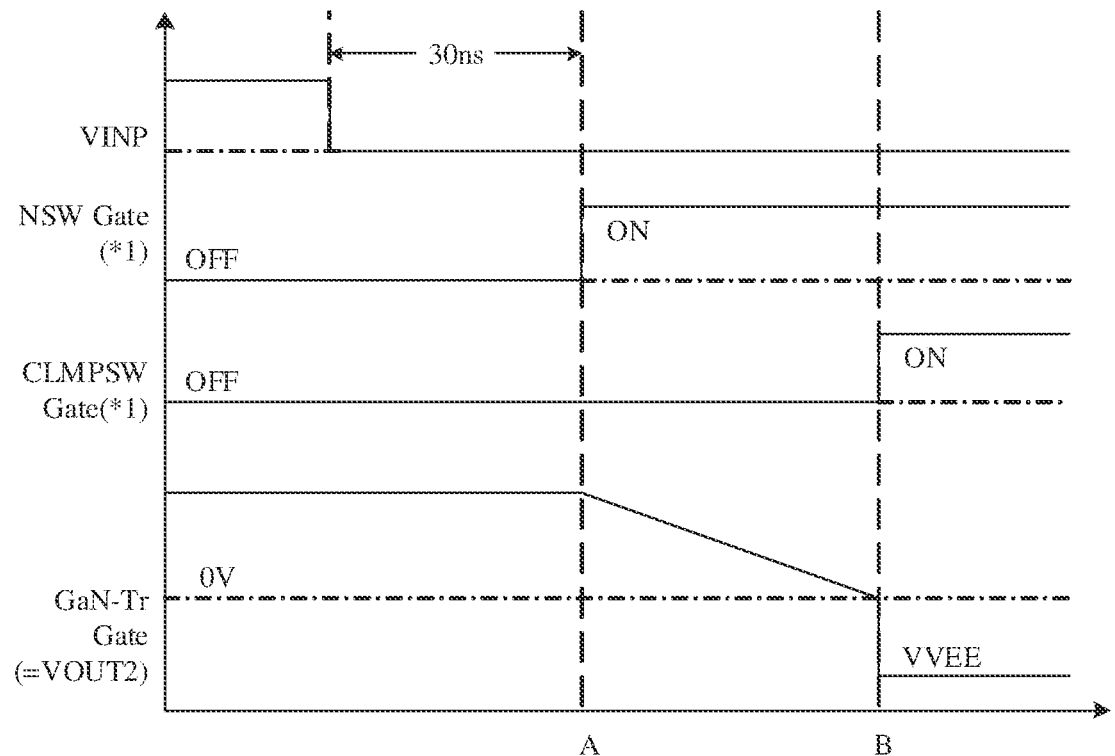
FIG. 8 is a diagram of a time sequence corresponding to a negative voltage turn-off circuit.

For example, FIG. 8 is a time sequence diagram of the negative voltage turn-off circuit corresponding to FIG. 7. Vinp indicates an upstream input voltage of a chip. NSW gate indicates a gate voltage of NSW. CLMPSW gate indicates a gate voltage of CLMPSW. As shown in FIG. 8, when Vinp decreases, the gate voltage of NSW increases, NSW is turned on, and the GaN power device is controlled to be turned off. Because another circuit such as a logic circuit further exists in the circuit, a time delay of 30 ns is generated when a signal of Vinp is transferred to the gate of NSW. At a moment A, NSW is turned on, a discharging current is generated, the GaN power device is discharged, and the gate voltage of the GaN power device decreases. When the gate voltage of the GaN power device decreases to 0, that is, at moment B, CLMPSW is turned on, and the gate voltage of the GaN power device decreases to a negative voltage, so that the power device can keep being turned off in a negative voltage state. In this way, a case in which the power device is turned on by mistake due to an excessively large value of the gate drive resistor can be avoided.

However, this manner does not resolve problems of a large switching loss, a large packaging difficulty, and high packaging costs when the gate drive resistor is packaged.

Manner 3: The drive charging current is proportional to the drive discharging current. In this manner, a gate drive controller performs proportional control on the drive charging current and the drive discharging current, so that the drive current presents a characteristic of "fast start and slow to point".

Figure 9:
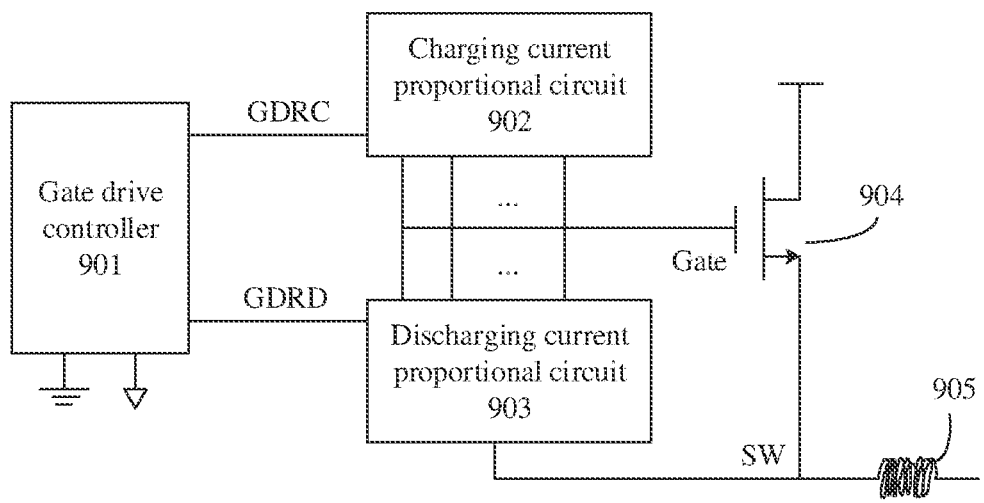
FIG. 9 is a diagram of a principle of a current proportional control manner.

For example, FIG. 9 is a diagram illustrating a principle of a current proportional control manner. A system shown in FIG. 9 includes a gate drive controller 901, a charging current proportional circuit 902, a discharging current proportional circuit 903, a power device 904, and a load 905.

The gate drive controller 901 generates two groups of control signals GDRC and GDRD. The control signal GDRC controls the charging current proportional circuit 902 to charge a gate of the power device 904, and the control signal GDRD controls the discharging current proportional circuit 903 to discharge the gate of the power device 904. A gate voltage Gate of the power device 904 is generated in a charging or discharging process. The gate voltage Gate controls turn-on and turn-off of the power device 904. An output signal SW of the power device 904 outputs a stable voltage as a working voltage of a subsequent circuit through the load 905.

The control signal GDRC output by the gate drive controller 901 may adjust the charging current output by the charging current proportional circuit 902, so that a charging speed of the gate voltage Gate is fast during startup, and the charging speed slows down when the gate voltage Gate approaches a maximum value. Therefore, EMI in a charging process is reduced. The control signal GDRD output by the gate drive controller 901 may adjust the discharging current output by the discharging current proportional circuit 903, so that a discharging speed of the gate voltage Gate is fast during startup, and the discharging speed slows down when the gate voltage Gate approaches a minimum value. Therefore, EMI in a discharging process is reduced.

However, in this manner, an output current controlled by the gate drive controller gradually decreases. When the gate voltage of the power device is the Miller plateau voltage, the gate drive controller outputs a small charging current when the gate voltage is the Miller plateau voltage, so that the power device generates a large conduction loss after the Miller plateau ends.

In conclusion, the gate drive resistor in Manner 1 and Manner 2 makes packaging of the switch mode power supply difficult, and packaging costs are high. In Manner 3, in the manner of proportional control of the charging current and the discharging current, it is not considered that the power device should be quickly and fully turned on after the Miller voltage. As a result, a conduction loss of the power device is large.

In view of this, embodiments of this specification provide a drive circuit and a drive system, to control a drive charging current segment by segment by using a circuit. The drive circuit outputs a first drive charging current when a voltage at a gate end of a power device does not reach a first threshold. When the voltage at the gate end of the power device reaches the first threshold, the drive circuit outputs a small second drive charging current, to adjust a turn-on speed of the power device after the voltage reaches the first threshold to reduce EMI. The first threshold may be a threshold voltage of the power device, or the first threshold may be a voltage close to the threshold voltage of the power device. When the voltage at the gate end of the power device reaches a second threshold, the drive circuit outputs a large third drive charging current, thereby shortening a time from the second threshold to full turn-on of the power device, and shortening a switching loss of the power device. A difference between the second threshold and the Miller voltage of the power device is less than a first value.

It may be understood that, after the voltage at the gate end of the power device is greater than the threshold voltage, the power device starts to be turned on, and enters the Miller plateau for a period of time after the power device starts to be turned on. In this period of time, a charging current is small, EMI is small, and the charging current is large after the power device is on the Miller plateau. In this way, a switching loss of the power device after the Miller plateau can be reduced. In addition, the drive circuit does not use a gate drive resistor, and does not need to be separately packaged, thereby reducing packaging difficulty and packaging costs.

For ease of understanding, descriptions of some concepts related to embodiments of this specification are provided as examples for reference.

Power device: A power device is configured to implement turn-on or turn-off based on a control signal. The power device may be an N-type power device, or may be a P-type power device. For example, the power device may be a P-type or N-type MOSFET, or may be a P-type or N-type insulated gate bipolar transistor (IGBT), or may be a power device improved based on the foregoing two device types.

The characteristics of the power device usually involve the threshold voltage and the Miller voltage.

Threshold voltage: A threshold voltage is the gate voltage required for forming a conductive channel between a source and a drain of the power device. When the power device is at the threshold voltage, the power device starts to be turned on. The threshold voltage may also be referred to as a startup voltage, or a turn-on voltage. For example, a threshold voltage of a germanium power device is approximately 0.3 V, a threshold voltage of a silicon power device is approximately 0.7 V, and a threshold voltage of a GaN device is approximately 1.4 V.

It should be noted that, in a turn-on process of the power device, when the voltage at the gate end of the power device does not reach the threshold voltage, the power device is in a turn-off state, there is no current change inside the power device, and no EMI is generated. When the voltage at the gate end of the power device reaches the threshold voltage, the power device starts to be turned on, there is a voltage change and a current change inside the power device, and EMI starts to be generated.

For example, assume the power device is the N-type transistor. When the voltage at the gate end of the power device is less than the threshold voltage, the power device is in a turn-off state, there is no current change inside the power device, and no EMI is generated. When the voltage at the gate end of the power device is greater than or equal to the threshold voltage, the power device starts to be turned on, there is a voltage change and a current change inside the power device, and EMI starts to be generated.

For example, assume the power device is the P-type transistor. When the voltage at the gate end of the power device is greater than the threshold voltage, the power device is in a turn-off state, there is no current change inside the power device, and no EMI is generated. When the voltage at the gate end of the power device is less than or equal to the threshold voltage, the power device starts to be turned on, there is a voltage change and a current change inside the power device, and EMI starts to be generated.

Miller voltage: A Miller voltage may also be referred to as a Miller plateau voltage of the power device. There are equivalent capacitors between the gate and the source, between the source and the drain, and between the gate and the drain of the power device. A capacitor Cgd between the gate and the drain is a Miller capacitor. The Miller capacitor varies with the voltage between the gate and the drain. In a turn-on process of the power device, after the gate charges a gate-source capacitor Cgs to a voltage value, the charging current of the gate charges the Miller capacitor Cgd. As a result, the voltage between the gate and the source stops changing, and reaches a plateau. The plateau is a Miller plateau, and the voltage value is the Miller voltage.

It should be noted that EMI generated by the power device during the Miller plateau period is large. In a turn-on process of the power device, the gate charges Cgs. When a voltage at the gate end reaches a Miller voltage, the gate charges Cgd. Therefore, the voltage between the source stage and the drain stage changes rapidly, and large EMI is generated. In a turn-off process of the power device, Cgs is discharged through the gate. When the voltage at the gate end reaches the Miller voltage, the discharging current of the gate discharges to the Miller capacitor Cgd, the voltage at the gate end stops changing, and the voltage between the source and the drain of the power device changes rapidly, thereby generating large EMI.

For example, assume the power device is the N-type transistor, and the Miller voltage of the power device is greater than the threshold voltage of the power device. When the voltage at the gate end of the power device is less than the Miller plateau voltage, there is no current change or the current change is small inside the power device, so that no EMI is generated or the EMI is small. When the voltage at the gate end of the power device is the Miller voltage, an internal current of the power device changes greatly, a voltage changes greatly, and large EMI is generated. The power device needs to reduce a drive charging current or a drive discharging current to reduce the EMI during the Miller plateau period.

For example, assume the power device is the P-type transistor, and the Miller voltage of the power device is less than the threshold voltage of the power device. When the voltage at the gate end of the power device is greater than the Miller plateau voltage, there is no current change or the current change is small inside the power device, so that no EMI is generated or the EMI is small. When the voltage at the gate end of the power device is the Miller voltage, an internal current of the power device changes greatly, a voltage changes greatly, and large EMI is generated. The power device needs to reduce the drive charging current or a drive discharging current to reduce the EMI during the Miller plateau period, to meet an EMI requirement of the power device.

In this embodiment of this specification, turn-on or turn-off of the power device may be controlled by outputting the drive charging current or the drive discharging current by the drive circuit. The following describes the drive circuit.

The drive circuit may include a plurality of drive units. For example, the drive circuit includes three drive units: a first drive unit, a second drive unit, and a third drive unit. A quantity of drive units is not limited in this embodiment of this specification.

The plurality of drive units are configured to drive turn-on or turn-off of the power device in phases in a turn-on process and a turn-off process of the power device. Each drive unit may include one or more N-type transistors and/or one or more P-type transistors. A specific structure of the drive unit is not limited in this embodiment of this specification. In a possible implementation, the plurality of drive units further include a negative voltage turn-off circuit. The negative voltage turn-off circuit is used to control negative voltage turn-off of the power device, to avoid the power device from being turned on by mistake.

The following describes in detail the drive circuit provided in this embodiment of this specification with reference to the accompanying drawings.

The drive circuit provided in this embodiment of this specification includes a first drive unit, a second drive unit, and a third drive unit. An output end of the first drive unit, an output end of the second drive unit, and an output end of the third drive unit are configured to connect to a gate end of a power device.

In this embodiment of this specification, for possible structures of the first drive unit, the second drive unit, the third drive unit, and the power device, refer to descriptions of related concepts in embodiments of this specification. Details are not described herein again. The drive circuit plays different roles in a turn-on process and a turn-off process of the power device. A working principle of the drive circuit in the turn-on process and the turn-off process of the power device is separately described in subsequent embodiments.

The drive circuit is configured to drive the power device to be turned on. The first drive unit is configured to: when receiving a first control signal, output a first drive charging current to a gate end, so that a voltage at the gate end reaches a first threshold. The second drive unit is configured to output a second drive charging current to the gate end, so that the voltage at the gate end reaches a second threshold from the first threshold. The third drive unit is configured to: after the voltage at the gate end reaches the second threshold, output a third drive charging current to the gate end. The third drive charging current is greater than the first drive charging current and the second drive charging current. A difference between the second threshold and a Miller plateau voltage of the power device is less than a first value.

In this embodiment of this specification, the first control signal indicates to turn on the power device, and the first control signal may be a rising edge or a falling edge of a square wave signal. For example, the first control signal may be a rising edge of a PWM signal input by the switch mode power supply controller. The first control signal may also be a rising edge or a falling edge of a pulse signal, for example, a rising edge of a pulse frequency modulation (PFM) signal.

In this embodiment of this specification, the third drive charging current is greater than the first drive charging current and the second drive charging current. It may be understood that a drive charging current of the power device during the Miller voltage plateau is related to EMI, and a larger drive charging current indicates larger EMI. The N-type transistor is used as an example. When the gate end voltage of the N-type transistor is equal to the Miller voltage, the drive charging current is reduced, and the generated EMI is reduced.

It should be noted that a higher voltage at the gate end of the power device indicates smaller internal resistance of the power device. To reduce a loss of the power device when the power device is fully turned on, the power device continues to be charged after the Miller voltage, so that the voltage at the gate end reaches the voltage when the power device is fully turned on. The N-type transistor is used as an example. To reduce a loss of a power device, the gate voltage of the power device when the power device is fully turned on is higher than the Miller voltage of the power device. When the gate end voltage of the N-type transistor is greater than the Miller voltage, the drive charging current is increased, the time from the power device to the full turn-on is shortened, and the turn-on loss is reduced.

It may be understood that, in a turn-on process of the power device, when the voltage at the gate end of the power device reaches the first threshold, the drive circuit outputs a small drive charging current, so that the drive charging current of the power device during the Miller plateau is small and EMI is small. When the voltage at the gate end of the power device reaches the second threshold, the drive circuit outputs a large third drive charging current, so that time until the power device is fully turned on is shortened, thereby reducing a turn-on loss of the power device.

In this embodiment of this specification, the first drive charging current may be greater than the second drive charging current, or may be less than or equal to the second drive charging current.

In this embodiment of this specification, the first threshold may be a threshold voltage, or may be a voltage close to the threshold voltage. When the first threshold is the threshold voltage, the power device starts to be turned on after the voltage reaches the first threshold, and the drive circuit outputs a slightly smaller drive charging current, so that a current change and a voltage change of the power device on a Miller plateau component are small, and generated EMI is small.

When the first threshold is a voltage close to the threshold voltage, the power device outputs a slightly smaller drive charging current during the Miller plateau, and EMI generated by the power device during the Miller plateau is reduced.

For example, when the power device is an N-type transistor, the first threshold may be a voltage slightly greater than the threshold voltage. When the power device is a P-type transistor, the first threshold may be a voltage slightly less than the threshold voltage.

In this embodiment of this specification, the difference between the second threshold and the Miller plateau voltage of the power device is less than the first value. The first value may be any value less than the difference between the Miller voltage and a breakdown voltage of the power device, and the first value is greater than zero. For example, when the power device is the N-type transistor, and the first value is 0.5, the second threshold is a voltage greater than the Miller voltage 0.5 V.

In a possible implementation, the first value is any value close to 0. For example, when the power device is the N-type transistor, the second threshold is a voltage value slightly higher than the Miller voltage. When the power device is the P-type transistor, the second threshold is a voltage value slightly lower than the Miller voltage. In this way, the power device has a large drive charging current after the Miller plateau, so that time for a voltage at the gate end of the power device to change from the Miller voltage to full turn-on voltage can be shortened, thereby reducing a turn-on loss of the power device.

Optionally, the second drive unit stops outputting the second drive charging current when the voltage at the gate end reaches the second threshold. Alternatively, the second drive unit continuously outputs the second drive charging current when the voltage at the gate end reaches the second threshold.

The drive circuit is used when the power device is turned off. The first drive unit is further configured to: when receiving a second control signal, output a first drive discharging current to the gate end, so that the voltage at the gate end reaches the second threshold. The second drive unit is further configured to output a second drive discharging current to the gate end, so that the voltage at the gate end reaches the first threshold from the second threshold. The third drive unit is further configured to: after the voltage at the gate end reaches the first threshold, output a third drive discharging current to the gate end. The third drive discharging current is greater than the first drive discharging current and the second drive discharging current.

In this embodiment of this specification, the second control signal may be a falling edge or a rising edge of a square wave signal. For example, the second control signal may be a falling edge of a PWM signal input by the switch mode power supply controller. The second control signal may also be a pulse signal, for example, a falling edge of a pulse frequency modulation (PFM) signal.

In this embodiment of this specification, values of the first threshold and the second threshold are described above, and details are not described herein again.

In this embodiment of this specification, the third drive discharging current is greater than the first drive discharging current and the second drive discharging current. The first drive discharging current may be greater than the second drive discharging current, or may be less than or equal to the second drive discharging current.

It may be understood that a drive discharging current of the power device during the Miller voltage plateau is related to EMI, and a larger drive discharging current causes larger EMI. The N-type transistor is used as an example. When the gate end voltage of the N-type transistor is equal to the Miller voltage, the drive discharging current is reduced, and the generated EMI is reduced.

It may be understood that, in a turn-off process of the power device, when the voltage at the gate end of the power device reaches the second threshold, the drive circuit outputs a small drive discharging current, so that the drive discharging current of the power device during the Miller plateau is small and EMI is small. When the voltage at the gate end of the power device reaches the first threshold, the drive discharging current increases, so that the power device continues to discharge after the threshold voltage is reached, and the voltage at the gate end reaches a voltage when the power device is fully turned off. A large third drive discharging current can shorten time from the Miller plateau of the power device to time when the power device is fully turned off, thereby reducing oscillation of the power device after the Miller plateau, increasing stability of the voltage at the gate end of the power device, and improving safety of the power device.

Optionally, the second drive unit stops outputting the second drive discharging current when the voltage at the gate end reaches the first threshold. Alternatively, the second drive unit continuously outputs the second drive discharging current when the voltage at the gate end reaches the first threshold.

Figure 10:
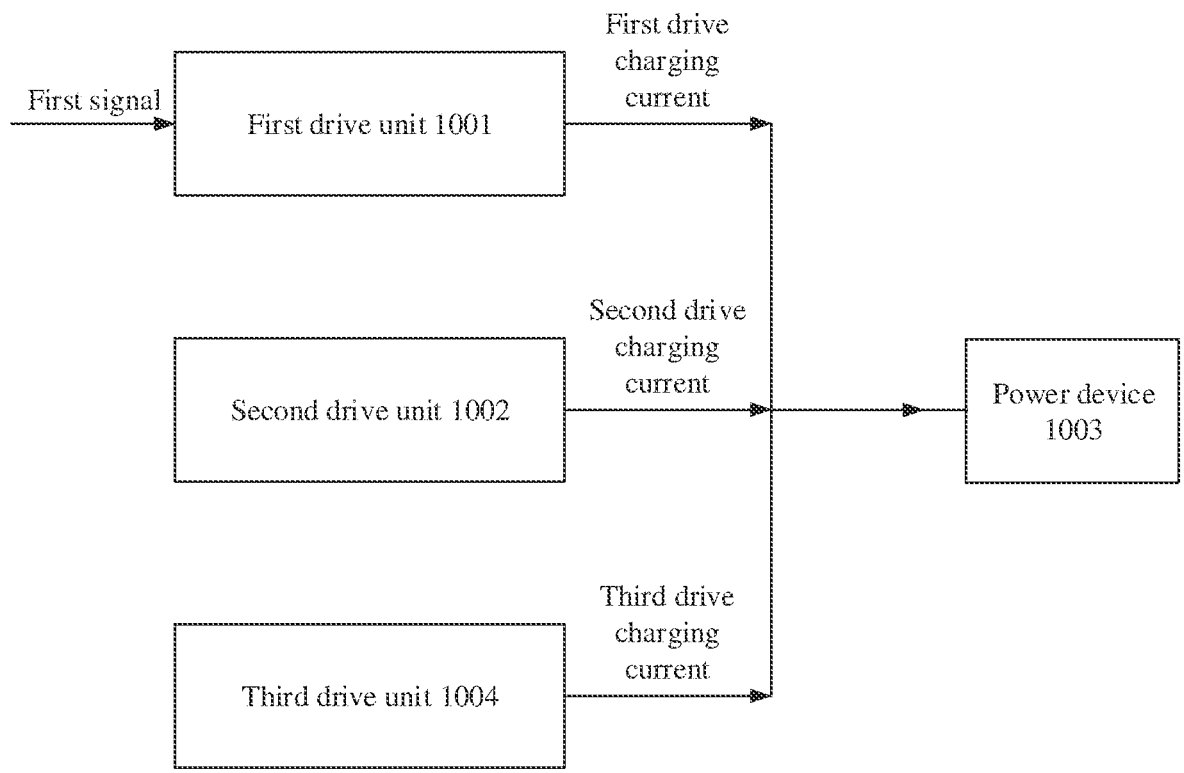
FIG. 10 is a schematic diagram of a structure of a drive circuit according to an embodiment.

The following describes in detail the drive circuit in embodiments of this specification with reference to FIG. 10. FIG. 10 is a schematic diagram of a structure of a drive circuit according to an embodiment of this specification. As shown in FIG. 10, the drive circuit includes a first drive unit 1001, a second drive unit 1002, and a third drive unit. An output end of the first drive unit 1001, an output end of the second drive unit 1002, and an output end of the third drive unit 1004 are all connected to a gate end of a power device 1003.

For possible structures of the first drive unit 1001, the second drive unit 1002, the third drive unit 1004, and the power device 1003, refer to descriptions of related concepts in embodiments of this specification. Details are not described herein again. A manner of connecting the first drive unit 1001, the second drive unit 1002, the third drive unit 1004, and the power device 1003 is for reference only. This is not specifically limited in this embodiment of this specification.

In a turn-on process of the power device, the first drive unit 1001 is configured to: when receiving a first control signal, output a first drive charging current to the gate end, so that a voltage at the gate end reaches a first threshold. The second drive unit 1002 is configured to output a second drive charging current to the gate end, so that the voltage at the gate end reaches the first threshold. The third drive unit 1004 is configured to: after the voltage at the gate end reaches the second threshold, output a third drive charging current to the gate end, where the third drive charging current is greater than the first drive charging current and the second drive charging current.

The first control signal is used to control turn-on of the power device 1003. Possible implementations of the first control signal and the first threshold are described above, and details are not described herein again.

In a turn-off process of the power device, the first drive unit 1001 is configured to: when receiving a second control signal, output a first drive discharging current to the gate end, so that the voltage at the gate end reaches the second threshold. The second drive unit 1002 is further configured to output a second drive discharging current to the gate end, so that the voltage at the gate end reaches the first threshold from the second threshold. The third drive unit 1004 is configured to: after the voltage at the gate end reaches the first threshold, output a third drive discharging current to the gate end. The third drive discharging current is greater than the first drive discharging current and the second drive discharging current.

The second control signal is used to control turn-off of the power device. Possible implementations of the second control signal and the second threshold are described above, and details are not described herein again.

In this embodiment of this specification, for possible values of the first threshold and the second threshold, refer to descriptions of related concepts in embodiments of this specification. Details are not described herein again.

The power device 1003 in FIG. 10 includes an N-type transistor and a P-type transistor. The following describes a turn-on process and a turn-off process of the N-type transistor by using a time sequence diagram shown in FIG. 11, and describes a turn-on process and a turn-off process of the P-type transistor by using a time sequence diagram shown in FIG. 12.

Figure 11:
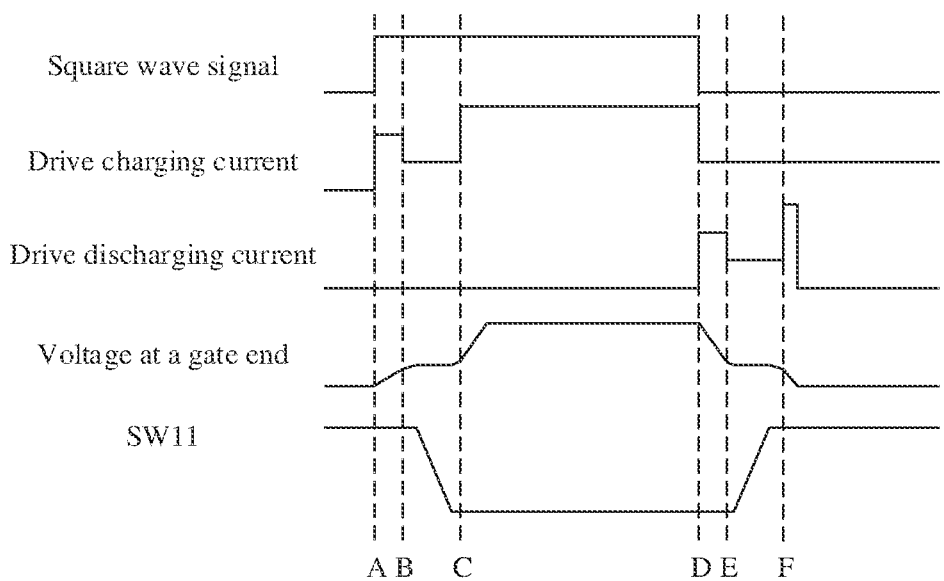
FIG. 11 is a diagram of a time sequence according to an embodiment.

For example, FIG. 11 is a time sequence diagram corresponding to FIG. 10 according to an embodiment of this specification. The power device is an N-type transistor in this example. The first threshold is a threshold voltage of the N-type transistor or a voltage value whose difference from the threshold voltage is a. The second threshold is a voltage value whose difference from the Miller voltage of the N-type transistor is b. Both a and b are variables and may be in units of millivolts or volts. As shown in FIG. 11, SW11 is a drain end signal of the N-type transistor.

In a turn-on process of the N-type transistor, a first control signal is a rising edge of a square wave. At a moment A, the rising edge of the square wave appears, and the first control signal is generated. The first drive unit starts to output the first drive charging current to the gate end. The N-type transistor is in an off state, and the SW11 signal is a high voltage. After the moment A, the voltage at the gate end rises to the first threshold, where when the voltage at the gate end rises to the threshold voltage, the power device starts to be turned on. In this case, an internal charging current of the N-type transistor is small, and the SW11 signal does not change.

At a moment B, the voltage value at the gate end is the first threshold, the first drive unit stops outputting the first drive charging current, and the second drive unit outputs the second drive charging current to the gate end. After the moment B, the voltage at the gate end continues to rise, and rises to the second threshold after passing through a Miller plateau. When the voltage at the gate end reaches the Miller voltage, the gate charges the Cgd, and the SW11 signal falls. When the Miller plateau ends, the SW11 signal stops falling and the N-transistor is turned on.

At a moment C, the voltage at the gate end is the second threshold, the second drive unit stops outputting the second drive charging current, and the third drive unit outputs the third drive charging current to the gate end, where the third drive charging current is greater than the first drive charging current. After the moment C, the voltage at the gate end continues to rise until the N-type transistor is fully turned on.

In a turn-off process of the N-type transistor, the second control signal is a falling edge of the square wave. At a moment D, the falling edge of the square wave appears, and the second control signal is generated. The first drive unit starts to output the first drive discharging current to the gate end.

At a moment E, the voltage at the gate end is the second threshold, the first drive unit stops outputting the first drive discharging current, the second drive unit outputs the second drive discharging current to the gate end, and the second drive discharging current is less than the first drive discharging current. When the voltage at the gate end of the N-type transistor reaches the Miller voltage, the Cgd discharges, the SW11 signal starts to rise, and the N-type transistor is turned off. When the Miller plateau period ends, the Cgd stops discharging and the SW11 signal stops rising.

At a moment F, the voltage at the gate end is the first threshold, the second drive unit stops outputting the second drive discharging current, and the third drive unit outputs the third drive discharging current to the gate end, where the third drive discharging current is greater than the first drive discharging current. The voltage at the gate end falls, and the threshold voltage falls to the voltage that is fully turned off.

Figure 12:
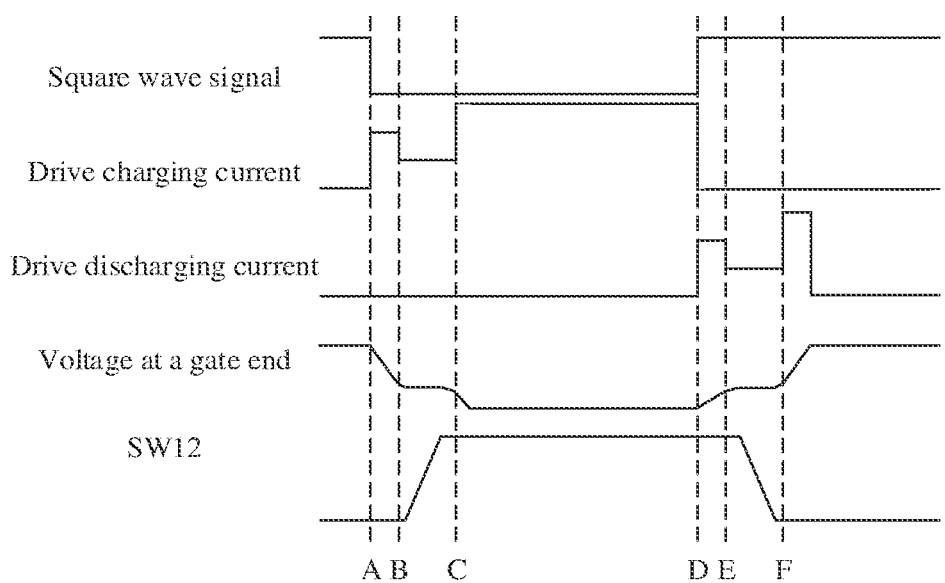
FIG. 12 is a diagram of a time sequence according to an embodiment.

For example, FIG. 12 is a time sequence diagram corresponding to FIG. 10. The power device is a P-type transistor in this example. The first threshold is a threshold voltage of the P-type transistor or a voltage value whose difference from the threshold voltage is c. The second threshold is a voltage value whose difference from the Miller voltage of the P-type transistor is d. c and d are variables and may be in units of millivolts or volts. As shown in FIG. 12, SW12 is a drain end signal of the P-type transistor. In a turn-on process of the P-type transistor, the first control signal is a falling edge of a square wave. At a moment A, the falling edge of the square wave appears, and the first control signal is generated. The first drive unit starts to output the first drive charging current to the gate end. After the moment A, the voltage at the gate end falls to the first threshold, where when the voltage at the gate end falls to the threshold voltage, the power device starts to be turned on. In this case, an internal charging current of the P-type transistor is small, and the SW12 signal does not change.

At a moment B, the voltage at the gate end is the first threshold, the first drive unit stops outputting the first drive charging current, and the second drive unit outputs the second drive charging current to the gate end. After the moment B, the voltage at the gate end continues to fall, and falls to the second threshold after passing through the Miller plateau. After the voltage at the gate end reaches the Miller voltage, the gate charges a Cgd, and the SW12 signal rises. When the Miller plateau ends, the SW12 signal stops falling and the P-transistor is turned on.

At a moment C, the voltage at the gate end is the second threshold, the second drive unit stops outputting the second drive charging current, and the third drive unit outputs the third drive charging current to the gate end, where the third drive charging current is greater than the first drive charging current. After the moment C, the voltage at the gate end continues to fall, and falls to a fully turned-on voltage after passing through the Miller plateau, thereby reducing a loss of the power device during operation.

In a turn-off process of the P-type transistor, the second control signal is a rising edge of a square wave. At a moment D, the rising edge of the square wave appears, the second control signal is generated, and the first drive unit starts to output the first drive discharging current to the gate end.

At a moment E, the voltage at the gate end is the second threshold, the first drive unit stops outputting the first drive discharging current, the second drive unit outputs the second drive discharging current to the gate end, and the second drive discharging current is less than the first drive discharging current. When the voltage at the gate end of the P-type transistor reaches the Miller voltage, the Cgd discharges, the SW12 signal starts to fall, and the P-type transistor is turned off. When the Miller plateau period ends, the Cgd stops discharging and the SW12 signal stops falling.

At a moment F, the voltage at the gate end is the first threshold, the second drive unit stops outputting the second drive discharging current, and the third drive unit outputs the third drive discharging current to the gate end, where the third drive discharging current is greater than the first drive discharging current.

In conclusion, in the turn-on process of the power device, when the voltage at the gate end reaches the first threshold, the second drive unit outputs a low second drive charging current, to reduce a drive charging current during the Miller plateau. Therefore, the EMI is further reduced. When the voltage at the gate end reaches the second threshold, the third drive unit outputs a third drive current, to reduce a loss of the power device from being in the Miller plateau to full turn-on of the power device. In addition, the drive circuit does not require use of a gate drive resistor, and does not need to be separately packaged, thereby reducing packaging difficulty, simplifying packaging of an intelligent power module, and reducing packaging costs.

In a turn-off process of the power device, when the voltage at the gate end of the power device reaches the second threshold, the second drive unit outputs a low second drive discharging current, to reduce a drive discharging current of the power device during the Miller plateau. Therefore, the EMI is further reduced. When the voltage at the gate end reaches the first threshold, the third drive unit outputs a large third drive discharging current, to reduce oscillation of the power device after the Miller plateau, increase stability of the voltage at the gate end of the power device, and further improve safety of the power device.

It should be noted that, in the foregoing drive circuit, there may be an additional control unit, and the first control signal may be generated by the control unit. Alternatively, both the first control signal and the second control signal may be generated based on the voltage at the gate end of the power device. For example, a feedback unit is disposed in the drive circuit, and the feedback unit is configured to enable the drive unit based on the voltage at the gate end.

Optionally, an input end of the feedback unit is connected to the gate end. Output of the feedback unit is configured to enable the first drive unit, the second drive unit, and the third drive unit. The feedback unit is configured to: when the voltage at the gate end does not reach the first threshold, enable the first drive unit; or when the voltage at the gate end reaches the first threshold and does not reach the second threshold, enable the second drive unit, and disable the first drive unit; or when the voltage at the gate end reaches the second threshold, enable the third drive unit, and disable the second drive unit or continuously enable the second drive unit.

Optionally, the feedback unit is configured to: when the voltage at the gate end does not reach the second threshold, enable the first drive unit; or when the voltage at the gate end reaches the second threshold and does not reach the first threshold, enable the second drive unit, and disable the first drive unit; or when the voltage at the gate end reaches the first threshold, enable the third drive unit, and disable the second drive unit or continuously enable the second drive unit. It may be understood that a drive current output by the second drive unit is small, and when the voltage at the gate end is greater than or equal to the second threshold, the second drive unit may continuously output the second drive current.

In a possible implementation, the feedback unit compares the voltage at the gate end with the first threshold and/or the second threshold, and outputs an enable signal, to further control the drive unit.

In this embodiment of this specification, the feedback unit may implement self-control of the drive circuit, and implement that the drive circuit automatically adjusts enabling and disabling of the drive unit based on the voltage at the gate end. Therefore, control accuracy of the drive circuit is improved.

Figure 13:
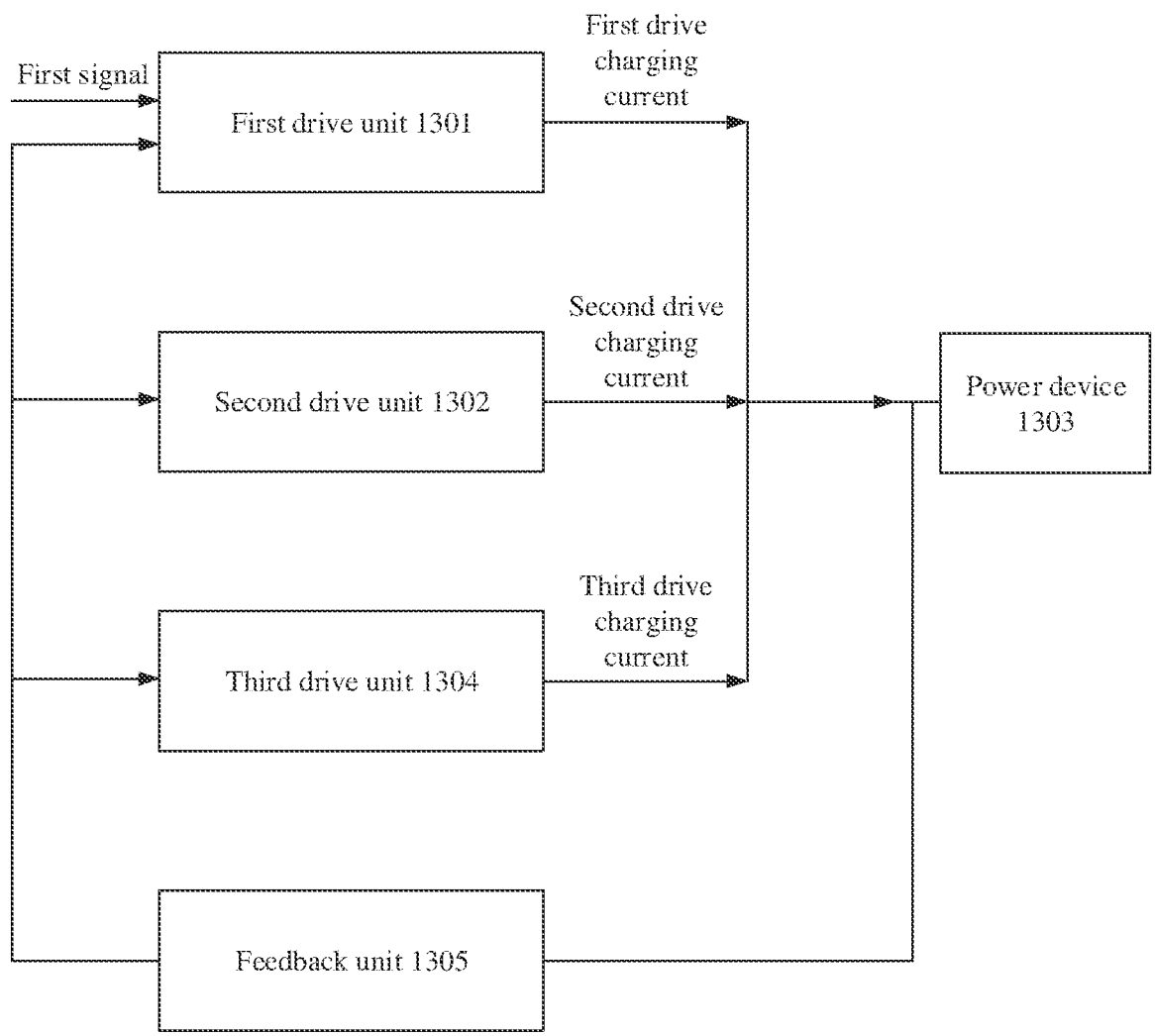
FIG. 13 is a schematic diagram of a structure of a drive circuit according to an embodiment.

The following describes, with reference to FIG. 13, a drive circuit obtained by adding a feedback unit.

As shown in FIG. 13, the drive circuit includes: a first drive unit 1301, a second drive unit 1302, a power device 1303, a third drive unit 1304, and a feedback unit 1305.

An input end of the feedback unit 1305 is connected to a gate end of the power device 1303, and an output end of the feedback unit 1305 is connected to the first drive unit 1301, the second drive unit 1302, and the third drive unit 1304.

The feedback unit 1305 is configured to enable the first drive unit 1301, the second drive unit 1302, and the third drive unit 1304.

Specifically, in turn-on process of the power device, the feedback unit 1305 is configured to: when the voltage at the gate end does not reach the first threshold, enable the first drive unit 1301; or when the voltage at the gate end reaches the first threshold and does not reach the second threshold, enable the second drive unit 1302, and disable the first drive unit; or when the voltage at the gate end reaches the second threshold, enable the third drive unit 1304, and disable the second drive unit 1302 or continuously enable the second drive unit 1302. In a turn-off process of the power device, the feedback unit 1305 is configured to: when the voltage at the gate end does not reach the second threshold, enable the first drive unit 1301; or when the voltage at the gate end reaches the second threshold and does not reach the first threshold, enable the second drive unit 1302, and disable the first drive unit 1301; or when the voltage at the gate end reaches the first threshold, enable the third drive unit 1304, and disable the second drive unit 1302 or continuously enable the second drive unit 1302.

For example, in a turn-on process of an N-type transistor, the feedback unit is configured to: when the voltage at the gate end is less than the first threshold, enable the first drive unit 1301; or when the voltage at the gate end is greater than or equal to the first threshold and less than the second threshold, enable the second drive unit 1302, and disable the first drive unit; or when the voltage at the gate end is greater than or equal to the second threshold, enable the third drive unit 1303, and disable the second drive unit 1302 or continuously enable the second drive unit 1302.

In a turn-off process of the N-type transistor, the feedback unit is configured to: when the voltage at the gate end is greater than the second threshold, enable the first drive unit 1301; or when the voltage at the gate end is less than or equal to the second threshold and greater than the first threshold, enable the second drive unit 1302 and disable the first drive unit; or when the voltage at the gate end is less than or equal to the first threshold, enable the third drive unit 1303, and disable the second drive unit 1302 or continuously enable the second drive unit 1302.

When the power device is the N-type transistor, for a time sequence corresponding to the drive circuit shown in FIG. 13, refer to the time sequence in FIG. 11. Details are not described herein again.

For example, in a turn-on process of a P-type transistor, the feedback unit is configured to: when the voltage at the gate end is greater than the first threshold, enable the first drive unit 1301; or when the voltage at the gate end is less than or equal to the first threshold and greater than the second threshold, enable the second drive unit 1302, and disable the first drive unit; or when the voltage at the gate end is less than or equal to the second threshold, enable the third drive unit 1303, and disable the second drive unit 1302 or continuously enable the second drive unit 1302.

In a turn-off process of the P-type transistor, the feedback unit is configured to: when the voltage at the gate end is less than the second threshold, enable the first drive unit 1301; or when the voltage at the gate end is greater than or equal to the second threshold and less than the first threshold, enable the second drive unit 1302 and disable the first drive unit; or when the voltage at the gate end is greater than or equal to the first threshold, enable the third drive unit 1303, and disable the second drive unit 1302 or continuously enable the second drive unit 1302.

When the power device is the P-type transistor, for a time sequence corresponding to the drive circuit shown in FIG. 13, refer to the time sequence in FIG. 12. Details are not described herein again.

The following describes a possible structure of the feedback unit.

Figure 14:
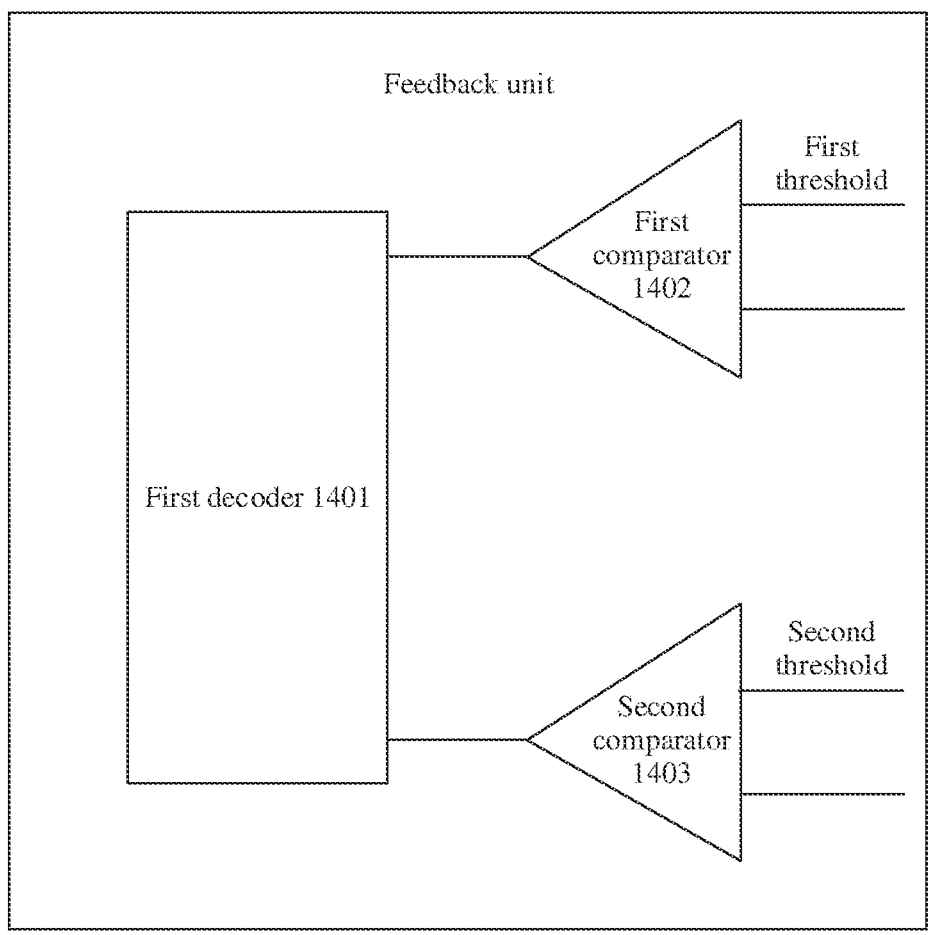
FIG. 14 is a schematic diagram of a structure of a feedback unit according to an embodiment.

Optionally, the feedback unit includes a first comparator, a second comparator, and a first decoder. A first input end of the first comparator is connected to the gate end, a second input end of the first comparator is connected to a first voltage, and an output end of the first comparator is connected to the first decoder, where a value of the first voltage is the first threshold. A first input end of the second comparator is connected to the gate end, a second input end of the second comparator is connected to a second voltage, and an output end of the second comparator is connected to the first decoder, where a value of the second voltage is the second threshold. A first output end of the first decoder is connected to an enabling end of the first drive unit, a second output end of the first decoder is connected to an enabling end of the second drive unit, and a third output end of the first decoder is connected to an enabling end of the third drive unit. For example, as shown in FIG. 14, the feedback unit includes a first decoder 1401, a first comparator 1402, and a second comparator 1403. An output end of the first comparator 1402 and an output end of the second comparator 1403 are respectively connected to two input ends of the first decoder 1401.

The first comparator 1402 and the second comparator 1403 are configured to determine an interval in which a voltage at the gate end is located and output a code value. Both the first comparator 1402 and the second comparator 1403 have two input ends. A first input end of the first comparator 1402 is connected to the gate end, a second input end of the first comparator 1402 is connected to a first voltage, and an output end of the first comparator 1402 is connected to the first decoder, where a value of the first voltage is the first threshold. A first input end of the second comparator 1403 is connected to the gate end, a second input end of the second comparator 1403 is connected to a second voltage, and an output end of the second comparator 1403 is connected to the first decoder, where a value of the second voltage is the second threshold. The first decoder 1401 is configured to convert the code values output by the first comparator 1402 and the second comparator 1403 into an enable signal and enable the drive unit. The first decoder 1401 may have three output ends. A first output end of the first decoder 1401 is connected to an enabling end of the first drive unit, a second output end of the first decoder 1401 is connected to an enabling end of the second drive unit, and a third output end of the first decoder 1401 is connected to an enabling end of the third drive unit. In a possible implementation, the first comparator and the second comparator compare the voltage at the gate end with the first threshold and/or the second threshold, and output a code value representing a voltage interval in which the voltage at the gate end is located. The first decoder 1401 is configured to generate three enable signals based on the code value to respectively control the first drive unit, the second drive unit, and the third drive unit.

For example, the voltage interval output by the two comparators is represented by using temperature code. Specifically, when the voltage at the gate end is less than the first threshold, the first comparator outputs 0, and the second comparator outputs 0; when the voltage at the gate end is greater than or equal to the first threshold and less than or equal to the second threshold, the first comparator outputs 1, and the second comparator outputs 0; or when the voltage at the gate end is greater than the second threshold, the first comparator outputs 1, and the second comparator outputs 1.

For example, the first decoder may convert the temperature code into one-hot code or other code. For example, the first decoder may convert 00 to 100, and control the first drive unit to output a first drive charging current; convert 10 to 010, and control the first drive unit to stop outputting the first drive charging current, and control the second drive unit to output a second drive charging current; and convert 11 to 001 or 011, control the second drive unit to stop outputting the second drive charging current or continuously output the second drive charging current, and control the third drive unit to output a third drive charging current.

It should be noted that, in an actual circuit of the feedback unit, enabling output by the feedback unit may be inaccurate due to impact of a preparation process or the like. For example, the enabling output by the feedback unit may be advanced, so that the second drive unit or the third drive unit outputs the drive current in advance or stops outputting the drive current in advance.

To avoid inaccurate enabling output by the feedback unit, based on the drive circuit provided in the foregoing embodiment, the drive circuit further includes a delay unit. The delay unit is configured to adjust enabling output by the first decoder.

Optionally, a first delay unit is disposed between the second output end of the first decoder and the enabling end of the second drive unit, and/or a second delay unit is disposed between a third output end of the first decoder and the enabling end of the third drive unit. The first delay unit is configured to delay enabling of the second drive unit, and the second delay unit is configured to delay enabling of the third drive unit.

It may be understood that, in actual production of the drive circuit, in the first comparator and the second comparator, the first threshold and/or the second threshold may deviate, thereby causing inaccurate feedback of the feedback unit, and increasing EMI and/or a switching loss.

For example, the second threshold in the second comparator is set to 2 V, and the second threshold in an actually produced drive circuit may be 1.9 V. If there is no delay unit, the drive circuit outputs the third drive charging current when the voltage at the gate end is 1.9 V, and the power device may be in a Miller plateau period. As a result, EMI of the power device is excessively large, and a switch mode power supply does not comply with a production standard. The delay unit is added to delay enabling of the drive unit, and the drive circuit is controlled to accurately output the third drive charging current when the voltage at the gate end is 2 V, to meet an EMI standard of the power device.

For example, assume the power device is an N-type transistor, the first threshold is greater than a threshold voltage of the N-type transistor, and a difference between the first threshold and the threshold voltage is a, the second threshold is greater than the Miller voltage, and a difference between the second threshold and the Miller voltage is b, where a and b are variables and may be in units of millivolts or volts. A time sequence diagram corresponding to the N-type transistor may be consistent with the time sequence diagram shown in FIG. 11.

Figure 15:
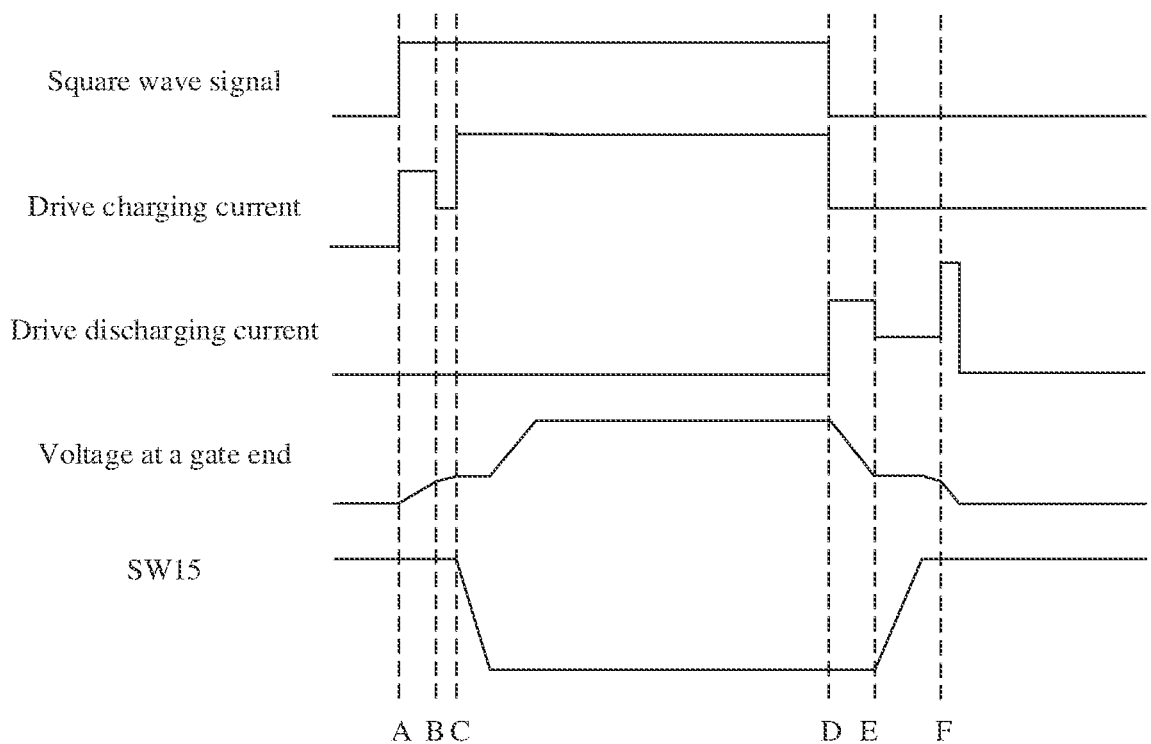
FIG. 15 is a diagram of a time sequence according to an embodiment.

If the second threshold of the second comparator in the feedback unit deviates and changes to a Miller voltage, a time sequence diagram corresponding to the N-type transistor is shown in FIG. 15. In a turn-on process of the N-type transistor, a first control signal is a rising edge of a square wave. At a moment A, the rising edge of the square wave appears, and the first control signal is generated. The first drive unit starts to output the first drive charging current to the gate end. At a moment B, the voltage value at the gate end is the first threshold, the first drive unit stops outputting the first drive charging current, and the second drive unit outputs the second drive charging current to the gate end. At a moment C, the voltage at the gate end is the Miller voltage, the second drive unit stops outputting the second drive charging current, and the third drive unit outputs the third drive charging current to the gate end, where the third drive charging current is greater than the first drive charging current and the second drive charging current. At the same time, an SW15 signal began to fall until the end of the Miller plateau period. A drive charging current of the N-type transistor during the Miller plateau period is large, and EMI is not reduced. This does not meet the EMI standard of the power device.

On this basis, a delay unit is added between the feedback unit and the drive unit, and can delay enabling of the drive unit, and further delay a time for outputting the third drive current by the third drive unit, so that a time sequence of the drive circuit is consistent with that in FIG. 11. This meets the EMI standard of the power device.

In this embodiment of this specification, the delay unit may adjust a result output by the feedback unit, to accurately control the drive unit of the drive circuit, thereby reducing EMI and reducing a switching loss.

To ensure that power devices with different internal resistance can be quickly turned on or off while meeting EMI requirements, based on the drive circuit provided in the foregoing embodiment, the drive circuit may further include an adjustment signal generation unit. The adjustment signal generation unit is connected to the second drive unit, and the adjustment signal generation unit is configured to control the second drive unit to generate the second drive charging current or the second drive discharging current.

The adjustment signal generation unit includes a reference current connector, a reference voltage connector, a resistor, a comparator array, and a second decoder. The reference current connector is connected to one end of the resistor and a reference current, the reference voltage connector is connected to the comparator array, the other end of the resistor is grounded, the one end of the resistor is further connected to an input end of the comparator array, an output end of the comparator array is connected to an input end of the second decoder, and an output end of the second decoder is connected to the second drive unit.

The resistor is configured to generate a resistor voltage at the one end of the resistor based on the reference current. The comparator array is configured to generate a comparison signal based on a reference voltage and the resistor voltage. The second decoder is configured to control, based on the comparison signal, the second drive unit to output the second drive charging current.

Figure 16:
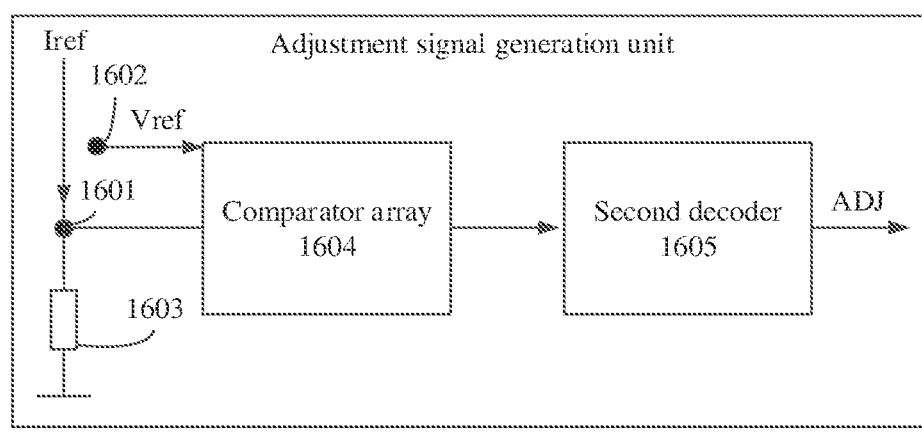
FIG. 16 is a schematic diagram of a structure of an adjustment signal generation unit according to an embodiment.

For example, a possible structure of the adjustment signal generation unit is shown in FIG. 16. The adjustment signal generation unit includes a reference current connector or terminal 1601, a reference voltage connector or terminal 1602, a resistor 1603, a comparator array 1604, and a second decoder 1605. The reference current connector or terminal 1601 is connected to one end of the resistor 1603 and a reference current, the reference voltage connector 1602 is connected to the comparator array 1604, the other end of the resistor 1603 is grounded, the one end of the resistor 1603 is further connected to an input end of the comparator array 1604, an output end of the comparator array 1604 is connected to an input end of the second decoder 1605, and an output end of the second decoder 1605 is connected to the second drive unit.

The resistor 1603 is configured to generate a resistor voltage at the one end of the resistor 1603 based on the reference current. The comparator array 1604 is configured to generate a comparison signal based on a reference voltage and the resistor voltage. The second decoder 1605 is configured to control, based on the comparison signal, the second drive unit to output the second drive charging current or the second drive discharging current.

It may be understood that the reference current and the reference voltage are a current value and a voltage value in a reference circuit. The reference circuit may be an additional circuit, or may be a part of the circuit in the switch mode power supply. A manner of obtaining the reference current and the reference voltage is introduced in the conventional technology. Details are not described in this embodiment of this specification.

In this embodiment of this specification, the adjustment signal generation unit changes a resistor value, the resistor voltage, and an adjustment signal, to change a driving current of the second drive unit.

In a possible implementation, the comparator array 1604 compares the resistor voltage generated by the resistor based on the reference current with the reference voltage, outputs a code value, and outputs an adjustment signal (for example, represented by ADJ) through the decoder, to change the driving current of the second drive unit.

In a possible implementation, the adjustment signal generation unit is connected to the second drive unit, and the adjustment signal may control a quantity of enabled PMOSs or NMOSs in the second drive unit, to further control a magnitude of the second drive charging current or the second drive discharging current that is output by the second drive unit.

In this embodiment of this specification, the resistance value of the resistor is adjusted to control the value of the second drive current, so that the drive circuit meets EMI requirements of power devices with different internal resistance, the drive circuit is applicable to a plurality of cases, and applicability of the drive circuit is improved.

In a possible implementation, the adjustment signal generation unit is further configured to control delay time of the delay unit.

Optionally, the adjustment signal generation unit further includes a third decoder. The output end of the comparator array is further connected to an input end of the third decoder, and an output end of the third decoder is connected to the second delay unit. The third decoder is configured to control, based on the comparison signal, the second delay unit to delay enabling of the third drive unit.

In this embodiment of this specification, a structure and a function of the third decoder are similar to those of the second decoder. Details are not described herein again.

In this way, different resistance values of the resistor are set, it is convenient to adjust, based on an actual situation, time for outputting a driving current by the third drive unit, inaccuracy in actual production and use of the drive circuit is avoided, and practicability of the drive circuit is improved.

In a possible implementation, the adjustment signal generation unit further includes one or more latches, configured to store the adjusted signal output by the second decoder or the third decoder. In this way, the adjustment signal generation unit may be turned off, thereby reducing running time of the adjustment signal generation unit and reducing an energy loss of the circuit.

Based on the drive circuit provided in the foregoing embodiment, the drive unit includes a charging current control module and a discharging current control module. The charging current control module is configured to control a value of a charging current, and the discharging current control module is configured to control a value of a discharging current.

Optionally, the first drive unit includes a first charging current control module and a first discharging current control module. The first charging current control module is configured to control a value of the first drive charging current, and the first discharging current control module is configured to control a value of the first drive discharging current. The second drive unit includes a second charging current control module and a second discharging current control module, the second charging current control module is configured to control a value of the second drive charging current, and the second discharging current control module is configured to control a value of the second drive discharging current. The third drive unit includes a third charging current control module and a third discharging current control module, the third charging current control module is configured to control a value of the third drive charging current, and the third discharging current control module is configured to control a value of the third drive discharging current.

In this way, the drive unit may adjust a driving current, to better meet application requirements of reducing EMI and improving a switching speed of the power device.

Figure 17A:
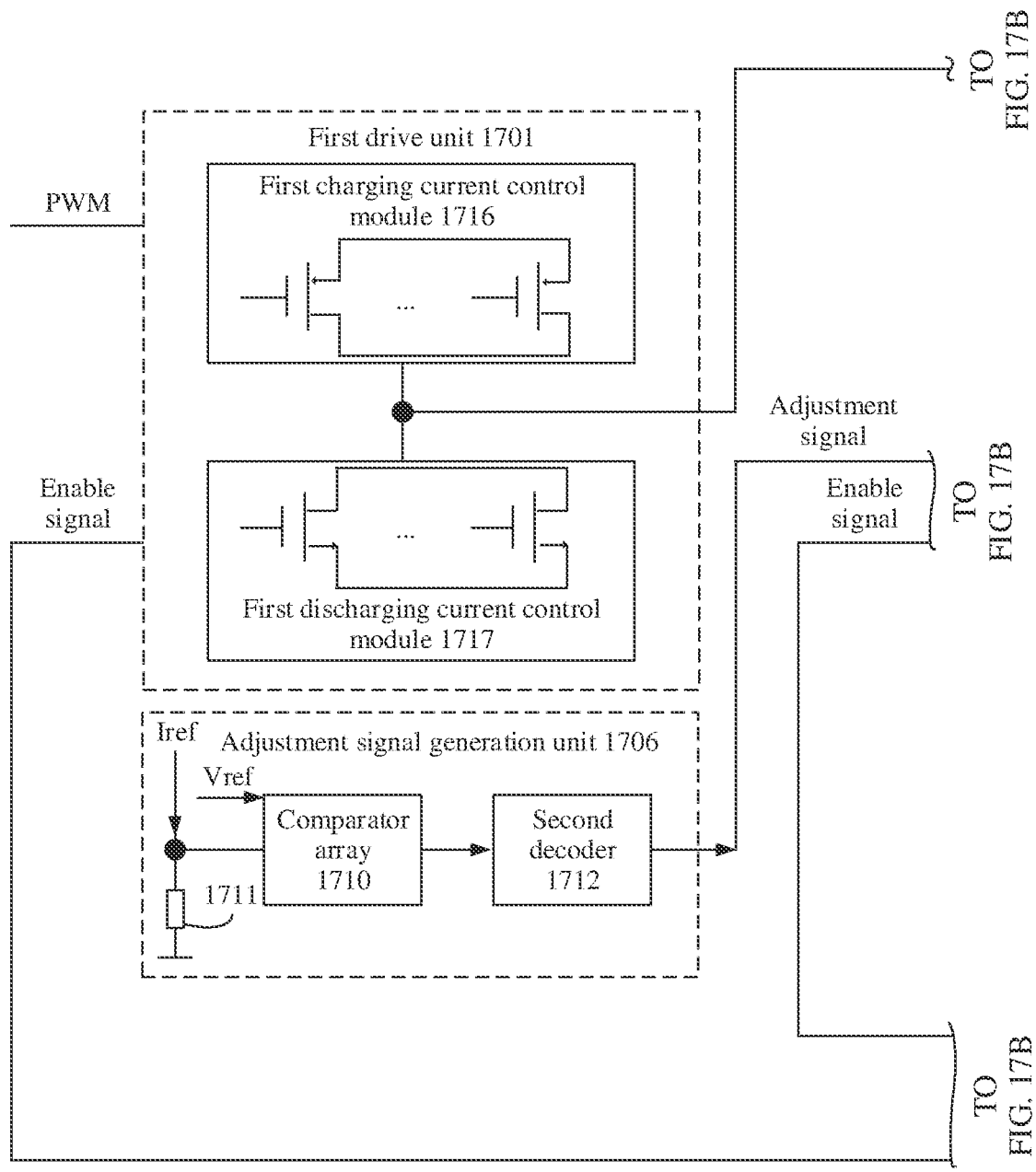
FIG. 17A to FIG. 17C are a schematic diagram of a structure of a specific drive circuit according to an embodiment.
Figure 17B:
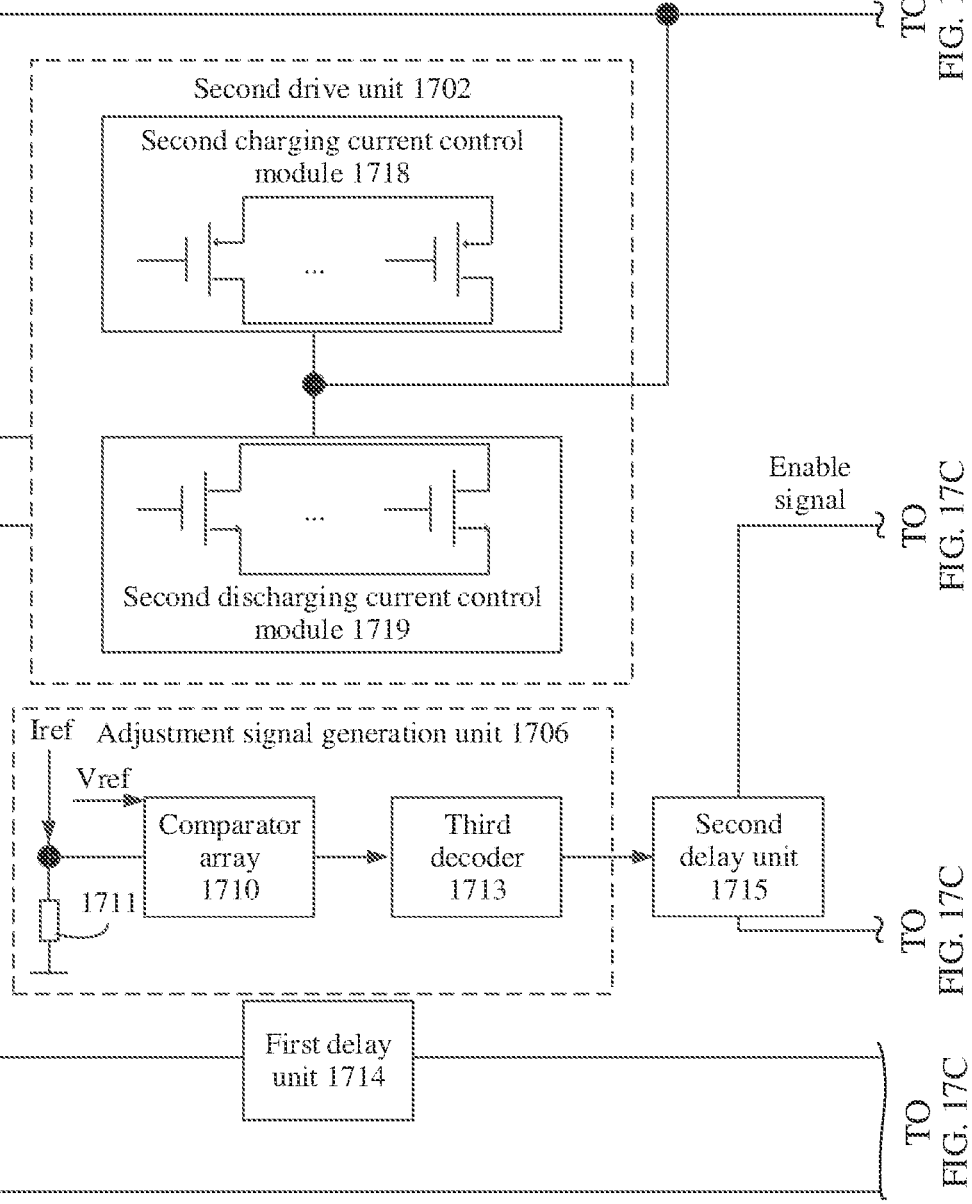
Figure 17C:
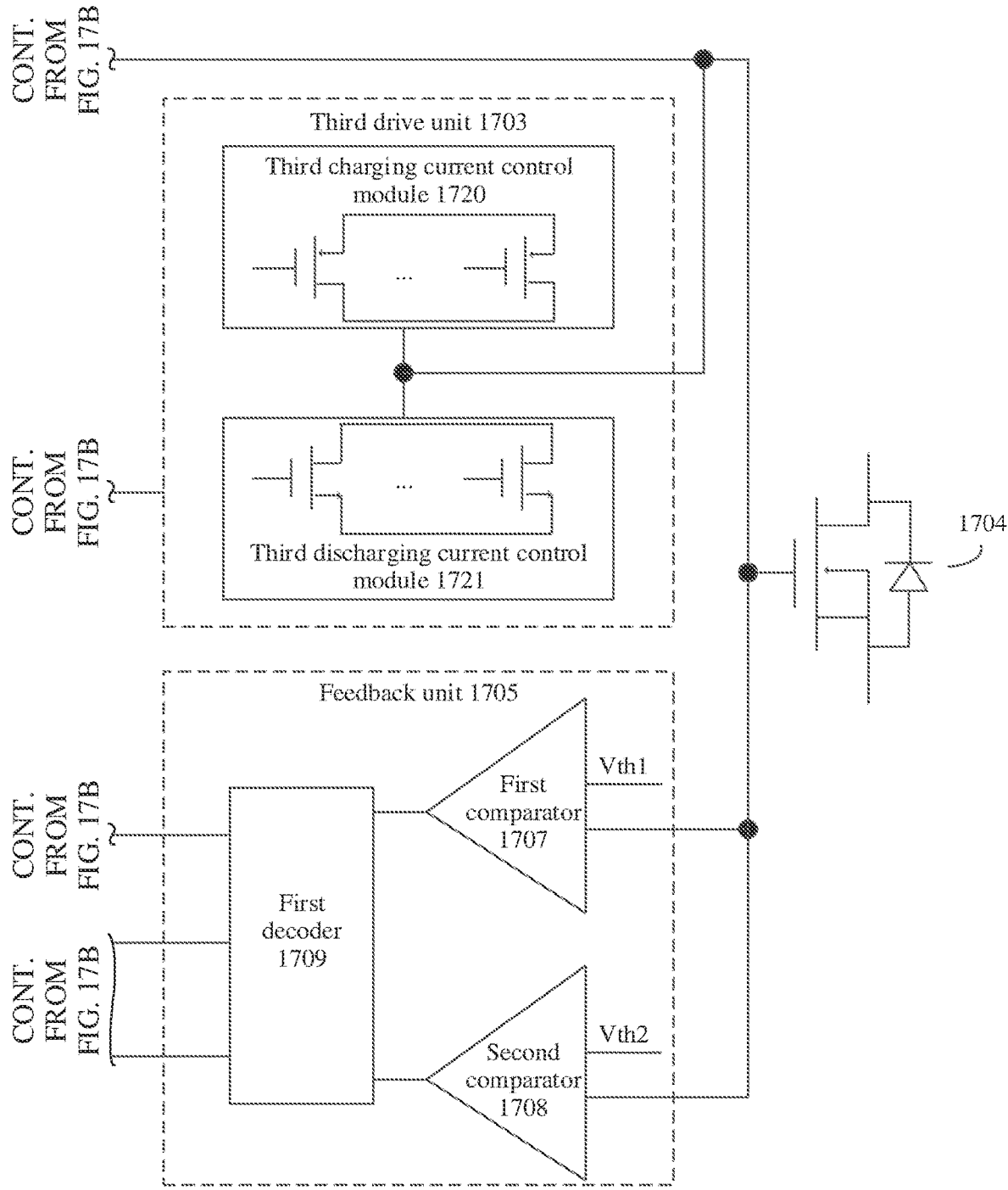

Optionally, the first charging current control module, the second charging current control module, and the third charging current control module all include a plurality of P-type transistors connected in parallel. The first discharging current control module, the second discharging current control module, and the third discharging current control module each include a plurality of N-type transistors connected in parallel. For example, FIG. 17A to FIG. 17C are together a circuit diagram of a specific drive circuit according to an embodiment of this specification. As shown, the circuit diagram includes a first drive unit 1701, a second drive unit 1702, a third drive unit 1703, a power device 1704, a feedback unit 1705, an adjustment signal generation unit 1706, a first delay unit 1714, and a second delay unit 1715.

The first drive unit 1701 includes a first charging current control module 1716 and a first discharging current control module 1717. The first charging current control module 1716 includes a plurality of P-type transistors connected in parallel, and is configured to control a value of the first drive charging current. The first discharging current control module 1717 includes a plurality of N-type transistors connected in parallel, and is configured to control a value of the first drive discharging current.

The second drive unit 1702 includes a second charging current control module 1718 and a second discharging current control module 1719. The second charging current control module 1718 includes a plurality of P-type transistors connected in parallel, and is configured to control a value of the second drive charging current. The second discharging current control module includes a plurality of N-type transistors connected in parallel, and is configured to control a value of the second drive discharging current.

The third drive unit 1703 includes a third charging current control module 1720 and a third discharging current control module 1721. The third charging current control module 1720 includes a plurality of P-type transistors connected in parallel, and is configured to control a value of the third drive charging current. The third discharging current control module 1721 includes a plurality of N-type transistors connected in parallel, and is configured to control a value of the third drive discharging current.

A structure of the power device 1704 is described above. Details are not described herein again.

The feedback unit 1705 includes a first comparator 1707, a second comparator 1708, and a first decoder 1709.

The adjustment signal generation unit 1706 includes a resistor 1711, a comparator array 1702, a second decoder 1712, and a third decoder 1713.

Output ends of the first drive unit 1701, the second drive unit 1702, and the third drive unit 1703 are connected, and are connected to a gate end of the power device 1704. The gate end of the power device is further connected to an input end of the first comparator 1707 and an input end of the second comparator 1708 in the feedback unit 1705. The first decoder 1709 in the feedback unit has three output ends. A first output end is connected to an enabling end of the first drive unit 1701, a second output end is connected to an enabling end of the second drive unit 1702, and a third output end is connected to an enabling end of the third drive unit 1703. The first delay unit 1714 is disposed between a second output end of the first decoder 1709 and the enabling end of the second drive unit 1702 in the feedback unit. The second delay unit 1715 is disposed between the third output end of the first decoder 1709 and the enabling end of the third drive unit 1703 in the feedback unit. In the adjustment signal generation unit 1706, the second decoder 1712 is connected to the second drive unit 1703, and the third decoder 1713 is connected to the second delay unit 1715.

The following describes an example working procedure of the drive circuit.

For example, before the drive circuit is powered on, an adjustment signal is determined based on a resistance value of the resistor 1711 in the adjustment signal generation unit 1706, to further determine the value of the second drive charging current or the value of the second drive discharging current, delay time of a signal controlled by the first delay unit, delay time of a signal controlled by the second delay unit, and the like.

The drive circuit receives a square wave signal (PWM) output by the controller in the switch mode power supply, and generates the first control signal when a rising edge of the square wave signal appears. The feedback unit 1705 outputs the first enable signal based on the voltage at the gate end, and controls the first drive unit 1701 to output the first drive charging current, so that the voltage at the gate end of the power device 1704 changes. When the voltage at the gate end of the power device 1704 reaches the first threshold, the feedback unit 1705 outputs a second enable signal to control the first drive unit 1701 to stop outputting the first drive charging current, and controls the second drive unit 1702 to output the second drive charging current. When the voltage at the gate end of the power device 1704 reaches the second threshold, the feedback unit 1705 outputs a third enable signal to control the second drive unit 1702 to stop outputting or continuously output the second drive charging current, and controls the third drive unit 1703 to output the third drive charging current. The first delay unit 1714 may delay the second enable signal, to adjust time for outputting the second drive charging current by the second drive unit. The second delay unit 1715 may delay the third enable signal, to adjust time for outputting the third drive charging current by the third drive unit.

When a falling edge appears in the square wave signal, a second control signal is generated. The feedback unit 1705 outputs the first enable signal based on the voltage at the gate end, and controls the first drive unit 1701 to output the first drive discharging current, so that the voltage at the gate end of the power device 1704 changes. When the voltage at the gate end of the power device 1704 reaches the second threshold, the feedback unit 1705 outputs the second enable signal to control the first drive unit 1701 to stop outputting the first drive discharging current, and controls the second drive unit 1702 to output the second drive discharging current. When the voltage at the gate end of the power device 1704 reaches the first threshold, the feedback unit 1705 outputs the third enable signal to control the second drive unit 1702 to stop outputting or continuously output the second drive discharging current, and controls the third drive unit 1703 to output the third drive discharging current. The first delay unit 1714 may delay the second enable signal, to adjust time for outputting the second drive discharging current by the second drive unit. The second delay unit 1715 may delay the third enable signal, to adjust time for outputting the third drive discharging current by the third drive unit.

According to the drive circuit provided in this embodiment of this specification, the second drive unit outputs a small second drive current, to reduce EMI of the power device and meet an EMI requirement. The third drive unit outputs a large third drive current, to shorten turn-on time or turn-off time of the power device and maintain high efficiency of the power device. The feedback unit drives based on the gate end voltage, to implement self-control of the drive circuit and improve stability of the gate voltage.

An embodiment of this specification further provides a drive system, including a power device and any one of the foregoing drive circuits, where the drive circuit is configured to drive the power device to turn on or turn off. The drive system may be a drive system applied to various electrical and electronic devices, and the electrical and electronic devices may be a program-controlled switch, a communication device, an electronic detection device, a control device, and the like.

Figure 18:
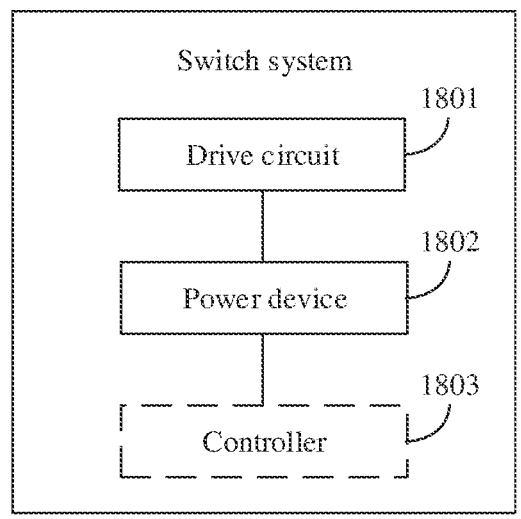
FIG. 18 is a schematic diagram of a structure of a drive system according to an embodiment.

For example, FIG. 18 is a schematic diagram of a structure of a drive system according to an embodiment of this specification. As shown in FIG. 18, the drive system includes a drive circuit 1801 and a power device 1802. The drive circuit 1801 is configured to drive the power device 1802 to turn on or turn off. The drive system may further include a controller 1803 or the like. The controller 1803 is configured to generate a control signal, and the control signal is used to indicate turn-on or turn-off of the power device 1802. For beneficial effects of the drive system provided in this embodiment of this specification, refer to beneficial effects brought by the foregoing drive circuit. Details are not described herein again.

An embodiment of this specification further provides a drive module, including the drive circuit in any one of the foregoing embodiments, where the drive circuit is configured to drive a power device to turn on or turn off.

Figure 19:
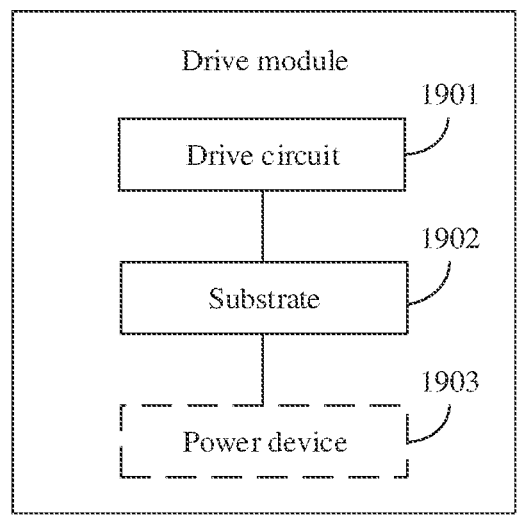
FIG. 19 is a schematic diagram of a structure of a drive module according to an embodiment.

For example, FIG. 19 is a schematic diagram of a structure of a drive module according to an embodiment of this specification. As shown in FIG. 19, the drive module includes a drive circuit 1901 and a substrate 1902. The drive circuit 1901 may be integrated on the substrate 1902. The drive module may further include a power device 1903 or the like. The power device 1903 is integrated on the substrate 1902.

For beneficial effects of the drive module provided in this embodiment of this specification, refer to beneficial effects brought by the foregoing drive circuit. Details are not described herein again.

An embodiment of this specification further provides an electronic device, including a power system, a power device, and any one of the foregoing drive circuits, where the drive circuit is configured to drive the power device to turn on or turn off. The power supply system is used to power the drive circuit.

The electronic device may be a switch mode power supply of various electrical and electronic devices, including but not limited to an adapter, a server power supply, and the like. The electrical and electronic devices may be a program-controlled switch, a communication device, an electronic detection device, a control device, and the like. The electronic device may also be an electrical and electronic device including a drive module, a drive system, or an integrated circuit.

Figure 20:
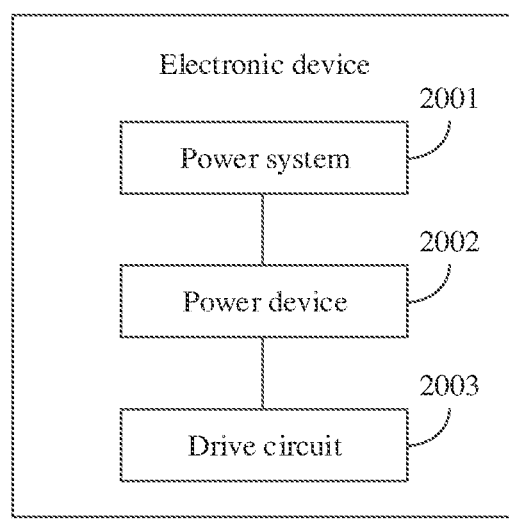
FIG. 20 is a schematic diagram of a structure of an electronic device according to an embodiment.

For example, FIG. 20 is a schematic diagram of a structure of an electronic device according to an embodiment of this specification. As shown in FIG. 20, the electronic device includes a power system 2001, a power device 2002, and a drive circuit 2003. The power system 2001 is configured to supply power to the drive circuit 2003, and the drive circuit 2003 is configured to drive the power device 2002 to turn on or turn off. The electronic device may further include another system, for example, a control system. For beneficial effects of the electronic device provided in this embodiment of this specification, refer to beneficial effects brought by the foregoing drive circuit. Details are not described herein again.

The foregoing implementations, schematic diagrams of structures, or schematic emulation diagrams are only examples for describing the technical solutions of this application. Size proportions thereof do not constitute any limitation on the protection scope of the technical solutions. Any modification, equivalent replacement, improvement, and the like made within the spirit and principle of the foregoing implementations shall fall within the protection scope of the technical solutions.

What is claimed is:

1. A drive circuit, wherein the drive circuit comprises a first driver, a second driver, and a third driver;
   an output end of the first driver, an output end of the second driver, and an output end of the third driver are configured to connect to a gate end of a power device;
   the first driver is configured to: when receiving a first control signal, output a first drive charging current to the gate end, so that a voltage at the gate end reaches a first threshold;
   the second driver is configured to output a second drive charging current, so that the voltage at the gate end reaches a second threshold from the first threshold;
   the third driver is configured to: after the voltage at the gate end reaches the second threshold, output a third drive charging current to the gate end, wherein the third drive charging current is greater than the first drive charging current and the second drive charging current;
   wherein the drive circuit further comprises an adjustment signal generation circuit connected to the second driver, and the adjustment signal generation circuit is configured to control the second driver to generate the second drive charging current or the second drive discharging current; and
   the adjustment signal generation circuit comprises a reference current terminal, a reference voltage terminal, a resistor, a comparator array, and a second decoder, wherein
   the reference current terminal is connected to one end of the resistor and a reference current, the reference voltage terminal is connected to the comparator array, the other end of the resistor is grounded, the one end of the resistor is connected to an input end of the comparator array, an output end of the comparator array is connected to an input end of the second decoder, and an output end of the second decoder is connected to the second driver;

the resistor is configured to generate a resistor voltage at the one end of the resistor based on the reference current;

the comparator array is configured to generate a comparison signal based on a reference voltage and the resistor voltage; and the second decoder is configured to control, based on the comparison signal, the second driver to output the second drive charging current or the second drive discharging current.

2. The drive circuit according to claim 1, wherein a difference between the second threshold and a Miller plateau voltage of the power device is less than a first value.

3. The drive circuit according to claim 1, wherein:

the first driver is configured to output a first drive discharging current to the gate end, so that the voltage at the gate end reaches the second threshold when receiving a second control signal;

the second driver is configured to output a second drive discharging current, so that the voltage at the gate end reaches the first threshold from the second threshold; and the third driver is configured to output a third drive discharging current to the gate end after the voltage at the gate end reaches the first threshold, wherein the third drive discharging current is greater than the first drive discharging current and the second drive discharging current.

4. A drive circuit, comprising:

a first driver, a second driver, and a third driver;

an output end of the first driver, an output end of the second driver, and an output end of the third driver are configured to connect to a gate end of a power device;

the first driver is configured to: when receiving a first control signal, output a first drive charging current to the gate end, so that a voltage at the gate end reaches a first threshold;

the second driver is configured to output a second drive charging current, so that the voltage at the gate end reaches a second threshold from the first threshold;

the third driver is configured to: after the voltage at the gate end reaches the second threshold, output a third drive charging current to the gate end, wherein the third drive charging current is greater than the first drive charging current and the second drive charging current;

wherein the feedback circuit comprises a first comparator, a second comparator, and a first decoder;

a first input end of the first comparator is connected to the gate end, a second input end of the first comparator is connected to a first voltage, and an output end of the first comparator is connected to the first decoder, wherein a value of the first voltage is the first threshold;

a first input end of the second comparator is connected to the gate end, a second input end of the second comparator is connected to a second voltage, and an output end of the second comparator is connected to the first decoder, wherein a value of the second voltage is the second threshold; and a first output end of the first decoder is connected to an enabling end of the first driver, a second output end of the first decoder is connected to an enabling end of the second driver, and a third output end of the first decoder is connected to an enabling end of the third driver; and wherein the drive circuit further comprises a feedback circuit, an input end of the feedback circuit is connected to the gate end, and an output of the feedback circuit is configured to enable the first driver, the second driver, and the third driver; and the feedback circuit is configured to:

when the voltage at the gate end does not reach the first threshold, enable the first driver; or when the voltage at the gate end reaches the first threshold and does not reach the second threshold, enable the second driver, and disable the first driver; or when the voltage at the gate end reaches the second threshold, enable the third driver and disable the second driver or continuously enable the second driver; or the feedback circuit is configured to:

when the voltage at the gate end does not reach the second threshold, enable the first driver; or when the voltage at the gate end reaches the second threshold and does not reach the first threshold, enable the second driver, and disable the first driver; or when the voltage at the gate end reaches the first threshold, enable the third driver and disable the second driver or continuously enable the second driver.

5. The drive circuit according to claim 1, wherein the adjustment signal generation circuit comprises a third decoder;

the output end of the comparator array is connected to an input end of the third decoder, and an output end of the third decoder is connected to a second delay unit; and the third decoder is configured to control, based on the comparison signal, the second delay unit to delay enabling of the third driver.

6. The drive circuit according to claim 1, wherein the first driver comprises a first charging current controller and a first discharging current controller, the first charging current controller is configured to control a value of the first drive charging current, and the first discharging current controller is configured to control a value of the first drive discharging current;

the second driver comprises a second charging current controller and a second discharging current controller, the second charging current controller is configured to control a value of the second drive charging current, and the second discharging current controller is configured to control a value of the second drive discharging current; and the third driver comprises a third charging current controller and a third discharging current controller, the third charging current controller is configured to control a value of the third drive charging current, and the third discharging current controller is configured to control a value of the third drive discharging current.

7. The drive circuit according to claim 1, wherein the first threshold is a threshold voltage of the power device, the first control signal is a rising edge or a falling edge of a pulse width modulation signal, and the second control signal is the falling edge or the rising edge of the pulse width modulation signal.

8. The drive circuit according to claim 1, wherein the drive circuit is configured to drive the power device to turn on or turn off.

9. The drive circuit according to claim 1, wherein the drive circuit is configured to drive the power device to turn on or turn off, and the power system is configured to supply electricity to the drive circuit.

10. A drive circuit for connection to a control terminal of a switching power device of a switch mode power supply, the drive circuit configured to:
apply a first drive charging current to induce a voltage at the control terminal that reaches a first threshold;
apply a second drive charging current to induce a voltage at the control terminal that reaches a second threshold different from the first threshold;
apply a third drive charging current to the control terminal once the induced voltage at the control terminal reaches the second threshold, wherein the third drive charging current is greater than the first drive charging current and the third drive charging current is greater than the second drive charging current;
the drive circuit further comprising an adjustment signal generation circuit configured to control the second drive charging current, the adjustment signal generation circuit comprising a reference current terminal, a reference voltage terminal, a resistor, a comparator array, and a second decoder, wherein:
the reference current terminal is connected to one end of the resistor and a reference current, the reference voltage terminal is connected to the comparator array, the other end of the resistor is grounded, the one end of the resistor is connected to an input end of the comparator array, an output end of the comparator array is connected to an input end of the second decoder, and an output end of the second decoder is connected to the second driver;
the resistor is configured to generate a resistor voltage at the one end of the resistor based on the reference current;
the comparator array is configured to generate a comparison signal based on a reference voltage and the resistor voltage; and
the second decoder is configured to control, based on the comparison signal, the second driver to output the second drive charging current or the second drive discharging current.

11. The drive circuit of claim 10 wherein the drive circuit is further configured to apply the first drive charging current in response to a control signal.

12. The drive circuit of claim 10 wherein the drive circuit comprises a first driver configured to apply the first drive charging current to the control terminal, a second driver configured to apply the second drive charging current to the control terminal, and a third driver configured to apply the third drive charging current to the control terminal.

13. The drive circuit of claim 10 further comprising a feedback circuit configured to selectively enable application of the first drive charging current or the second drive charging current or the third drive charging current based on comparing the voltage induced at the control terminal to the first threshold and/or the second threshold.

14. The drive circuit of claim 13 wherein the feedback circuit is configured to:
when the voltage induced at the control terminal does not reach the second threshold, enable application of the first drive charging current;
when the voltage induced at the control terminal reaches the second threshold and does not reach the first threshold, enable application of the second drive charging current and disabling application of the first drive charging current; and
when the voltage induced at the control terminal reaches the first threshold, enable application of the third drive charging current.

15. The drive circuit of claim 14 wherein the feedback circuit is further configured to disable application of the second drive charging current when the voltage induced at the control terminal reaches the first threshold.

16. The drive circuit of claim 14 wherein the feedback circuit is further configured continuously enable application of the second drive charging current to the control terminal.

17. The drive circuit of claim 10 further comprising a delay circuit.

18. The drive circuit of claim 17 wherein the delay circuit is configured to delay application of at least one of the first drive charging current, the second drive charging current and the third drive charting current to the control terminal.

* * * * *